(12) United States Patent
Jacobsen et al.

(10) Patent No.: US 7,288,432 B2
(45) Date of Patent: Oct. 30, 2007

(54) ELECTRONIC DEVICES WITH SMALL FUNCTIONAL ELEMENTS SUPPORTED ON A CARRIER

(75) Inventors: Jeffrey Jay Jacobsen, Hollister, CA (US); Glenn Wilhelm Gengel, Berthoud, CO (US); Mark A. Hadley, Newark, CA (US); Gordon S. W. Craig, Palo Alto, CA (US); John Stephen Smith, Berkeley, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 112 days.

(21) Appl. No.: 10/966,617

(22) Filed: Oct. 14, 2004

(65) Prior Publication Data

US 2005/0046018 A1 Mar. 3, 2005

Related U.S. Application Data

(62) Division of application No. 10/176,795, filed on Jun. 21, 2002, now Pat. No. 7,070,851, which is a division of application No. 09/268,755, filed on Mar. 16, 1999, now Pat. No. 6,468,638.

(51) Int. Cl.
  *H01L 23/538* (2006.01)
  *H01L 21/768* (2006.01)
(52) U.S. Cl. ............... 438/107; 438/125; 438/117
(58) Field of Classification Search ........... 438/117, 438/125, 107
  See application file for complete search history.

(56) References Cited

U.S. PATENT DOCUMENTS

| | | | |
|---|---|---|---|
| 3,903,590 A | 9/1975 | Yokogawa | ............ 29/577 |
| 4,670,770 A | 6/1987 | Tai | |
| 4,783,695 A | 11/1988 | Eichelberger et al. | ...... 257/668 |
| 4,818,855 A | 4/1989 | Mongeon et al. | |
| 4,857,893 A | 8/1989 | Carroll | |
| 4,918,811 A | 4/1990 | Eichelberger et al. | ...... 438/107 |
| 4,937,653 A | 6/1990 | Blonder et al. | |

(Continued)

FOREIGN PATENT DOCUMENTS

DE  2810005  3/1978

(Continued)

OTHER PUBLICATIONS

Search Report for PCT/US 00/02348 mailed Apr. 5, 2000; 5 pages.

(Continued)

*Primary Examiner*—M. Wilczewski
(74) *Attorney, Agent, or Firm*—Blakely, Sokoloff, Taylor & Zafman LLP

(57) ABSTRACT

Apparatuses and methods for forming displays are claimed. One embodiment of the invention relates to depositing a plurality of blocks onto a substrate and is coupled to a flexible layer having interconnect deposited thereon. Another embodiment of the invention relates to forming a display along a length of a flexible layer wherein a slurry containing a plurality of elements with circuit elements thereon washes over the flexible layer and slides into recessed regions or holes found in the flexible layer. Interconnect is then deposited thereon. In another embodiment, interconnect is placed on the flexible layer followed by a slurry containing a plurality of elements.

39 Claims, 19 Drawing Sheets

U.S. PATENT DOCUMENTS

| | | | |
|---|---|---|---|
| 4,957,776 A | 9/1990 | Higuchi et al. | |
| 4,990,462 A | 2/1991 | Sliwa, Jr. | |
| 5,008,213 A | 4/1991 | Kolesar | |
| 5,032,896 A | 7/1991 | Little et al. | |
| 5,048,179 A | 9/1991 | Shindo et al. | |
| 5,083,697 A | 1/1992 | Difrancesco | |
| 5,099,227 A | 3/1992 | Geiszler et al. | |
| 5,138,433 A | 8/1992 | Hiruta | 357/72 |
| 5,138,436 A | 8/1992 | Koepf et al. | |
| 5,188,984 A | 2/1993 | Nischiguchi | |
| 5,205,032 A | 4/1993 | Kuroda | |
| 5,212,625 A | 5/1993 | van Andel et al. | |
| 5,221,831 A | 6/1993 | Geiszler et al. | |
| 5,231,751 A | 8/1993 | Sachdev et al. | 29/852 |
| 5,241,456 A | 8/1993 | Marcinkiewicz et al. | 361/792 |
| D343,261 S | 1/1994 | Eberhardt et al. | |
| 5,298,685 A | 3/1994 | Bindra et al. | |
| 5,353,498 A | 10/1994 | Fillion et al. | |
| D353,343 S | 12/1994 | Eberhardt et al. | |
| 5,373,627 A | 12/1994 | Grebe | 29/841 |
| 5,378,880 A | 1/1995 | Eberhardt et al. | |
| 5,382,784 A | 1/1995 | Eberhardt et al. | |
| 5,382,952 A | 1/1995 | Miller | |
| 5,420,757 A | 5/1995 | Eberhardt et al. | |
| 5,422,513 A | 6/1995 | Marcinkiewicz | |
| 5,430,441 A | 7/1995 | Bickley et al. | |
| 5,434,751 A | 7/1995 | Cole et al. | 361/792 |
| 5,435,057 A | 7/1995 | Bindra et al. | |
| 5,444,223 A | 8/1995 | Blama | |
| RE35,119 E | 12/1995 | Blonder | |
| 5,514,613 A | 5/1996 | Santadrea et al. | |
| 5,517,752 A | 5/1996 | Sakata et al. | |
| 5,528,222 A | 6/1996 | Moskowitz et al. | |
| 5,545,291 A | 8/1996 | Smith et al. | 438/107 |
| 5,554,996 A | 9/1996 | Chatzipetros | 343/702 |
| 5,556,441 A | 9/1996 | Courtwright | |
| 5,557,470 A | 9/1996 | Shibayama | |
| 5,565,846 A | 10/1996 | Geiszler et al. | |
| 5,574,470 A | 11/1996 | De Vall | |
| D378,578 S | 3/1997 | Eberhardt et al. | |
| 5,612,254 A | 3/1997 | Mu et al. | 438/634 |
| 5,627,931 A * | 5/1997 | Ackley et al. | 385/88 |
| 5,682,143 A | 10/1997 | Brady et al. | |
| 5,707,902 A | 1/1998 | Chang et al. | |
| 5,708,419 A | 1/1998 | Isaacson et al. | |
| 5,715,594 A | 2/1998 | Patterson et al. | |
| 5,735,040 A | 4/1998 | Ochi et al. | |
| 5,745,984 A | 5/1998 | Cole, Jr. et al. | |
| 5,754,110 A | 5/1998 | Appalucci et al. | |
| 5,779,839 A | 7/1998 | Tuttle et al. | |
| 5,783,856 A | 7/1998 | Smith et al. | |
| 5,798,050 A | 8/1998 | Gaynes et al. | |
| 5,818,348 A | 10/1998 | Walczak et al. | |
| 5,824,186 A | 10/1998 | Smith et al. | |
| 5,904,545 A | 5/1999 | Smith et al. | |
| 5,910,770 A | 6/1999 | Ohara | |
| 5,914,862 A | 6/1999 | Ferguson et al. | |
| 5,995,006 A | 11/1999 | Walsh | |
| 6,018,299 A | 1/2000 | Eberhardt et al. | |
| 6,019,284 A | 2/2000 | Freeman et al. | |
| 6,031,450 A | 2/2000 | Huang | |
| 6,040,773 A | 3/2000 | Vega | |
| 6,044,046 A | 3/2000 | Diezmann et al. | |
| 6,064,116 A | 5/2000 | Akram | |
| 6,078,791 A | 6/2000 | Tuttle | |
| 6,091,332 A | 7/2000 | Eberhardt et al. | |
| 6,094,138 A | 7/2000 | Eberhardt et al. | |
| 6,094,173 A | 7/2000 | Nylander | |
| 6,100,804 A | 8/2000 | Brady et al. | |
| 6,107,920 A | 8/2000 | Eberhardt et al. | |
| 6,122,492 A | 9/2000 | Sears | |
| 6,133,833 A | 10/2000 | Sidlauskas et al. | |
| 6,133,835 A | 10/2000 | De Leeuw et al. | |
| 6,134,130 A | 10/2000 | connell | |
| 6,147,605 A | 11/2000 | Vega et al. | |
| 6,147,662 A | 11/2000 | Grabau et al. | |
| 6,164,551 A | 12/2000 | Altwasser | |
| 6,181,287 B1 | 1/2001 | Beigel | |
| 6,189,208 B1 | 2/2001 | Estes et al. | |
| 6,194,119 B1 | 2/2001 | Wolk et al. | |
| 6,195,858 B1 | 3/2001 | Ferguson et al. | |
| 6,204,163 B1 | 3/2001 | Panchou et al. | |
| 6,206,282 B1 | 3/2001 | Hayes et al. | |
| 6,211,572 B1 | 4/2001 | Fjelstad et al. | |
| 6,219,911 B1 | 4/2001 | Estes et al. | |
| 6,222,212 B1 | 4/2001 | Lee et al. | |
| 6,229,203 B1 | 5/2001 | Wojnarowski et al. | |
| 6,229,442 B1 | 5/2001 | Rolin | |
| 6,236,316 B1 | 5/2001 | Eberhardt et al. | |
| 6,246,327 B1 | 6/2001 | Eberhardt | |
| 6,252,508 B1 | 6/2001 | Vega et al. | |
| 6,262,692 B1 | 7/2001 | Babb | |
| 6,265,977 B1 | 7/2001 | Vega et al. | |
| 6,268,796 B1 | 7/2001 | Gnadinger et al. | |
| 6,274,391 B1 | 8/2001 | Wachtler et al. | |
| 6,274,508 B1 | 8/2001 | Jacobsen et al. | |
| 6,275,156 B1 | 8/2001 | Rasband | |
| 6,275,681 B1 | 8/2001 | Vega et al. | |
| 6,281,038 B1 | 8/2001 | Jacobsen et al. | |
| 6,281,794 B1 | 8/2001 | Duan et al. | |
| 6,282,407 B1 | 8/2001 | Vega et al. | |
| 6,291,896 B1 | 9/2001 | Smith | |
| 6,297,072 B1 | 10/2001 | Tilmans et al. | |
| 6,309,912 B1 | 10/2001 | Chiou et al. | |
| 6,313,747 B2 | 11/2001 | Imaichi et al. | |
| 6,320,543 B1 | 11/2001 | Ohata et al. | |
| 6,320,753 B1 | 11/2001 | Launay | |
| 6,329,213 B1 | 12/2001 | Tuttle et al. | |
| 6,329,917 B1 | 12/2001 | Leonard | |
| 6,357,005 B1 | 3/2002 | Devaux et al. | |
| 6,366,468 B1 | 4/2002 | Pan | |
| 6,384,425 B1 | 5/2002 | Huber et al. | |
| 6,392,213 B1 | 5/2002 | Martorana et al. | |
| 6,410,415 B1 | 6/2002 | Estes et al. | |
| 6,417,025 B1 | 7/2002 | Gengel et al. | |
| 6,420,266 B1 | 7/2002 | Smith et al. | |
| 6,448,109 B1 | 9/2002 | Karpman | |
| 6,468,638 B2 * | 10/2002 | Jacobsen et al. | 428/209 |
| 6,486,780 B1 | 11/2002 | Garber et al. | |
| 6,514,790 B1 | 2/2003 | Plettner et al. | |
| 6,523,734 B1 | 2/2003 | Kawai et al. | |
| 6,528,351 B1 | 3/2003 | Nathan et al. | |
| 6,530,649 B1 | 3/2003 | Pan | |
| 6,536,674 B2 | 3/2003 | Kayanakis et al. | |
| 6,542,444 B1 | 4/2003 | Rutsche | |
| 6,559,666 B2 | 5/2003 | Bernier et al. | |
| 6,590,346 B1 | 7/2003 | Hadley et al. | |
| 6,606,247 B2 | 8/2003 | Credelle et al. | |
| 6,611,237 B2 | 8/2003 | Smith | |
| 6,653,157 B2 | 11/2003 | Kondo | |
| 6,665,044 B1 | 12/2003 | Jacobsen et al. | |
| 6,677,186 B1 | 1/2004 | Zafrany et al. | |
| 6,696,785 B2 | 2/2004 | Shimoda et al. | |
| 6,727,970 B2 | 4/2004 | Grace et al. | |
| 6,779,733 B2 | 8/2004 | Akita | |
| 6,780,696 B2 | 8/2004 | Schatz | |
| 6,794,221 B2 | 9/2004 | Sayyah | |
| 6,816,380 B2 | 11/2004 | Credelle et al. | |
| 6,841,419 B2 | 1/2005 | Akita et al. | |
| 6,844,673 B1 | 1/2005 | Bernkopf | |
| 6,853,087 B2 | 2/2005 | Neuhaus et al. | |
| 6,856,086 B2 | 2/2005 | Grace et al. | |
| 6,863,219 B1 | 3/2005 | Jacobsen et al. | |
| 6,864,570 B2 | 3/2005 | Smith et al. | |

| | | | | | | |
|---|---|---|---|---|---|---|
| 6,867,983 | B2 | 3/2005 | Liu et al. | EP | 1302893 | 4/2006 |
| 6,908,295 | B2 | 6/2005 | Thielman et al. | JP | 11353439 | 12/1999 |
| 6,919,680 | B2 | 7/2005 | Shimoda et al. | JP | 2001175837 | 6/2001 |
| 6,957,481 | B1 | 10/2005 | Patrice | WO | WO88/02549 | 4/1988 |
| 7,102,520 | B2 | 9/2006 | Liu et al. | WO | WO99/41701 | 8/1999 |
| 7,120,987 | B2 | 10/2006 | Liu et al. | WO | WO 00/16493 | 3/2000 |
| 7,158,037 | B2 | 1/2007 | Forster et al. | WO | WO 00/23994 A | 4/2000 |
| 2001/0000631 | A1 | 5/2001 | Zandman et al. | WO | WO 00/52109 | 9/2000 |
| 2001/0031514 | A1 | 10/2001 | Smith et al. | WO | WO 01/33621 | 5/2001 |
| 2001/0035759 | A1 | 11/2001 | Bernier et al. | WO | WO 01/62517 | 8/2001 |
| 2001/0055835 | A1 | 12/2001 | Pendse | WO | WO 01/75789 | 10/2001 |
| 2002/0001046 | A1 | 1/2002 | Jacobsen et al. | WO | 02/49093 A1 | 6/2002 |
| 2002/0018357 | A1 | 2/2002 | Oguchi et al. | WO | WO 02/097724 | 12/2002 |
| 2002/0041234 | A1 | 4/2002 | Kuzma et al. | WO | WO 03/063211 | 7/2003 |
| 2002/0061392 | A1 | 5/2002 | Jacobsen et al. | WO | WO 2004/006259 | 1/2004 |
| 2002/0093396 | A1 | 7/2002 | Smith et al. | WO | WO 2004/005494 | 3/2004 |
| 2002/0097664 | A1 | 7/2002 | Hiroaki | WO | WO 2004/097731 | 11/2004 |
| 2002/0114587 | A1 | 8/2002 | Golwaker et al. | | | |
| 2002/0127864 | A1 | 9/2002 | Smith et al. | | | |
| 2002/0149107 | A1 | 10/2002 | Chang et al. | | | |
| 2002/0167450 | A1 | 11/2002 | Korden et al. | | | |
| 2003/0029921 | A1 | 2/2003 | Akita et al. | | | |
| 2003/0034400 | A1 | 2/2003 | han et al. | | | |
| 2003/0036249 | A1 | 2/2003 | Bauer et al. | | | |
| 2003/0054881 | A1 | 3/2003 | Hendrick et al. | | | |
| 2003/0112192 | A1 | 6/2003 | King et al. | | | |
| 2003/0136503 | A1 | 7/2003 | Green | | | |
| 2003/0148555 | A1 | 8/2003 | Akita et al. | | | |
| 2003/0232174 | A1 | 12/2003 | Chang et al. | | | |
| 2004/0037053 | A1 | 2/2004 | Akita | | | |
| 2004/0052202 | A1 | 3/2004 | Brollier | | | |
| 2004/0052203 | A1 | 3/2004 | Brollier | | | |
| 2004/0089408 | A1 | 5/2004 | Brod et al. | | | |
| 2005/0093678 | A1 | 5/2005 | Forster et al. | | | |

FOREIGN PATENT DOCUMENTS

| | | |
|---|---|---|
| DE | 2810054 A1 | 9/1978 |
| DE | 19929 610 | 10/2000 |
| EP | 0277606 A2 | 8/1988 |
| EP | 0450950 A2 | 10/1991 |
| EP | A-0450950 | 10/1991 |
| EP | 0498703 A1 | 8/1992 |
| EP | 0992939 | 4/2000 |
| EP | 1014302 | 6/2000 |
| EP | 1111537 A2 | 6/2001 |
| EP | 1167068 | 1/2002 |

OTHER PUBLICATIONS

PCT international Written Opinion, PCT Application No. PCT US02/16474. Mailed Oct. 2002.

PCT international Written Opinion, PCT Application No. PCT US03/02115. (4 pages).

PCT international Search Report, PCT Application No. PCT US2005/002534. Mailed Nov. 11, 2005.

PCT Written Opinion Report, PCT Application No. PCT US2005/002534. Mailed Nov. 11, 2005 (7 pages).

PCT Notification of Transmittal of International Preliminary Examination report for PCT Application No. PCT US02/16474. Mailed Jul. 21, 2005 (5 pages).

IPRP Chapter 1, PCT Application No. PCT/US2004/009070, (7 pages) mailed Oct. 13, 200.

PCT Notification of Transmittal of International Search Report and The Written Opinion of the International Searching Authority, or the Declaration for PCT/US2005/040772, mailed on Jul. 26, 2006 (15 pages).

Kriebel, Frank (2005). RFID Chip and Tag Assembly Challenges: Low Cost RFID IC Packaging and Assembly Workshop, Nov. 14, 2005, Munich, Germany. (12 pgs).

IPRP Chapter 1, PCT Application No. PCT/US2005/002534, (9 pages) mailed Aug. 10, 2006.

PCT Notification of Transmittal of International Search Report and The Written Opinion of the International Searching Authority for PCT/US2004/09070, mailed on Feb. 10, 2005 (12 pages).

* cited by examiner

ELECTRONIC DEVICES WITH SMALL FUNCTIONAL ELEMENTS SUPPORTED ON A CARRIER

RELATED APPLICATIONS

This is a divisional of U.S. patent application Ser. No. 10/176,795, filed on Jun. 21, 2002 now U.S. Pat. No. 7,070,581, which is a divisional of U.S. patent application Ser. No. 09/268,755, filed on Mar. 16, 1999, now U.S. Pat. No. 6,468,638.

BACKGROUND INFORMATION

1. Field of the Invention

The present invention relates generally to the field of fabricating electrical assemblies which include functional blocks that are deposited onto a substrate.

2. Description of Related Art

Various different types of assemblies include functional blocks which are separately fabricated and then are deposited onto receiving regions of a substrate. One such type of an assembly is a display panel. Fabrication of display panels is well known in the art. Display panels may be comprised of active matrix or passive matrix panels. Active matrix panels and passive matrix panels may be either transmissive or reflective. Transmissive displays include polysilicon thin-film transistor (TFT) displays, and high-resolution polysilicon displays. Reflective displays typically comprise single crystal silicon integrated circuit substrates that have reflective pixels.

Liquid crystals, electroluminescent (EL) materials, organic light emitting diodes (OLEDs), up and downconverting phosphor (U/DCP), electrophoretic (EP) materials, or light emitting diodes (LEDs) may be used in fabricating flat-panel display panels. Each of these is known in the art and is discussed briefly below.

Liquid crystal displays (LCDs) can have an active matrix backplane in which thin-film transistors are co-located with LCD pixels. Flat-panel displays employing LCDs generally include five different components or layers: a White or sequential Red, Green, Blue light source, a first polarizing filter, that is mounted on one side of a circuit panel on which the TFTs are arrayed to form pixels a filter plate containing at least three primary colors arranged into pixels, and a second polarizing filter. A volume between the circuit panel and the filter plate is filled with a liquid crystal material. This material will rotate the polarized light when an electric field is applied between the circuit panel and a transparent ground electrode affixed to the filter plate or a cover glass. Thus, when a particular pixel of the display is turned on, the liquid crystal material rotates polarized light being transmitted through the material so that it will pass through the second polarizing filter. Some liquid crystal materials, however, require no polarizers. LCDs may also have a passive matrix backplane which is usually two planes of strip electrodes which sandwich the liquid crystal material. However, passive matrices generally provide a lower quality display compared to active matrices. U/DCP and EP displays are formed in a similar fashion except the active medium is different (e.g., upconverting gas, downconverting gas, electrophoretic materials).

EL displays have one or more pixels that are energized by an alternating current (AC) that must be provided to each pixel by row and column interconnects. EL displays generally provide a low brightness output because passive circuitry for exciting pixel phosphors typically operates at a pixel excitation frequency that is low relative to the luminance decay time of the phosphor material. However, an active matrix reduces the interconnect capacitance allowing the use of high frequency AC in order to obtain more efficient electroluminescence in the pixel phosphor. This results in increased brightness in the display.

LED displays are also used in flat-panel displays. LEDs emit light when energized. OLEDs operate like the LEDs except OLEDs use organic material in the formation of the diode.

Regardless of the type of active medium used, displays are generally comprised of at least a substrate and a backplane. The backplane forms the electrical interconnection of the display and comprises electrodes, capacitors, and transistors in at least some embodiments of a backplane.

FIG. 1A illustrates a rigid display device wherein the active matrix display backplane 10 is coupled to a rigid substrate 12. Typically, the active matrix display backplane is also rigid. FIG. 1B shows another rigid display. There, the active matrix display backplane 10 is coupled to a rigid substrate 12 (e.g., glass). Also shown is a plurality of blocks 14. These blocks may be fabricated separately and then deposited into holes on substrate 12 by a process known as fluidic self assembly (FSA); an example of this process is described in U.S. Pat. No. 5,545,291. These blocks may each contain driver circuitry (e.g. MOSFET and capacitor) for driving a pixel electrode. The active matrix backplane includes transparent pixel electrodes and row/column interconnects (not shown) to electrically interconnect the blocks 14. The plurality of blocks 14 is coupled to the active matrix display backplane 10 and the rigid substrate 12. FIG. 1C shows a reflective display 16 coupled to a rigid substrate 12. FIG. 1D shows a reflective display 16 coupled to a rigid substrate 12. A plurality of blocks 14 is coupled to the reflective display 16 and to the rigid substrate 12.

Placing elements, such as pixel drivers, on a rigid substrate is well known. Prior techniques can be generally divided into two types: deterministic methods or random methods. Deterministic methods, such as pick and place, use a human or robot arm to pick each element and place it into its corresponding location in a different substrate. Pick and place methods generally place devices one at a time and are generally not applicable to very small or numerous elements such as those needed for large arrays, such as an active matrix liquid crystal display.

Random placement techniques are more effective and result in high yields if the elements to be placed have the right shape. U.S. Pat. No. 5,545,291 describes a method that uses random placement. In this method, microstructures are assembled onto a different substrate through fluid transport. This is sometimes referred to as fluidic self-assembly. Using this technique, various blocks, each containing a functional component, may be fabricated on one substrate and then separated from that substrate and assembled onto a separate rigid substrate through the FSA process. The blocks which are deposited onto receptor regions of a substrate may include any of a number of different functional components, such as LEDs, pixel drivers, sensors, etc. An example of a particular type of block and its functional component is described in copending U.S. patent application Ser. No. 09/251,220 which was filed Feb. 16, 1999 by the inventor John Stephen Smith and which is entitled "Functionally Symmetric Integrated Circuit Die". This application is hereby incorporated herein by reference.

As noted above, FIGS. 1B and 1D illustrate a display substrate 12 with blocks 14 formed in the rigid substrate 12. These blocks 14 may be deposited through an FSA process.

In the FSA process, a slurry containing the blocks 14 is deposited over the rigid substrate 12 and the blocks 14 rest in corresponding openings in the substrate 12.

FIG. 2 shows a block 14 and a circuit element (not showing) on the top surface 18 of block 14. Generally, blocks 14 have a trapezoidal cross-section where the top of the block is wider than the bottom of the block 14.

FIG. 3 shows block 14 in a recessed region of the rigid substrate 12. Between the block 14 and the rigid substrate is an eutetic layer 13. The block 14 has a top surface 18.

FIG. 4 shows a planar side view of a rigid substrate coupled to a rigid display backplane with a plurality of blocks between the display backplane 30 and substrate 12. The plurality of blocks are functionally part of the display backplane 30 and are deposited onto receptor regions of the substrate 12. Each block drives at least one transparent pixel electrode. The pixel electrode is fabricated over a transistor which is fabricated in the block.

FIG. 5 shows a portion of an array in an active matrix display backplane. The control line rows 31 and 32 in this device are coupled to gate electrodes along a row and the control line columns 34 and 35 are coupled to data drivers which supply pixel voltages which are applied to the pixel electrodes. A column line 34 is connected to a source electrode of field effect transistor (FET) 36. Another column line 35 is coupled to a source electrode of FET 37. A row line 32 is coupled to the gates of both FETs 36 and 37. The drain of FET 36 is coupled through capacitor 38 to a transparent pixel electrode along the row 32 formed by FETs 36 and 37, and the drain of FET 37 is coupled through a capacitor to another pixel electrode along the row. In one typical example, the backplane may be formed by depositing blocks, using an FSA technique, into a rigid substrate (e.g., glass); each block contains a FET and a capacitor and is interconnected to other blocks by column and row conductors that are deposited onto the rigid substrate; and, the capacitor is coupled to a pixel electrode by another conductor that is deposited onto the rigid substrate. The active medium (e.g., a liquid crystal) is deposited at least on the pixel electrodes which will optically change the active medium's properties in response to the combined voltages or currents produced by the pixel electrodes. The active medium at a given pixel electrode 42 will appear as a square or dot in the overall checkerboard type matrix of the display. The actual size of the FETs and the pixel electrodes 42 are not now drawn to scale, but are shown schematically for the purposes of illustration.

Several disadvantages exist relative to the related art. Display resolution of a flexible display is limited by the amount of interconnect placed on a flexible substrate. Too much interconnect allowing increased conductance of current could damage a substrate made of plastic. Accordingly, it is desirable to use extensive web process interconnect in a display to increase resolution but avoid the problem of a flexible substrate (e.g., plastic substrate) from being harmed by the interconnect.

BRIEF SUMMARY OF THE INVENTION

The present invention provides apparatuses and methods for creating an assembly with an electrical interconnect. A plurality of blocks are deposited onto a substrate. An interconnect layer is placed onto a flexible layer that is coupled to the substrate.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

BRIEF DESCRIPTION OF THE DRAWINGS

The present invention is illustrated by way of example. The invention is not limited to the figures of the accompanying drawings in which like references indicate similar elements. Note also that the elements in the figures are not drawn to scale.

DETAILED DESCRIPTION

Figure 1A:
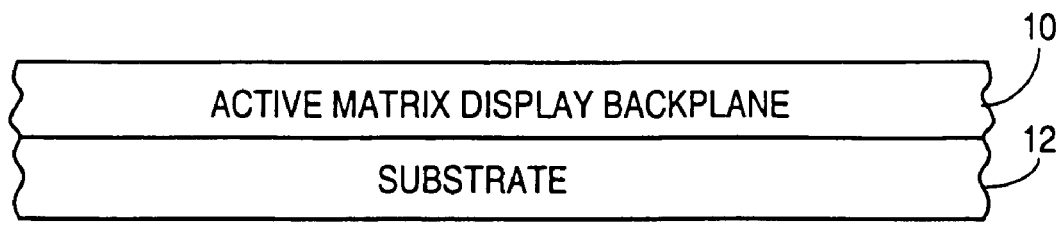
FIG. 1A shows a planar side view of an active matrix display backplane coupled to a rigid substrate.
Figure 1B:
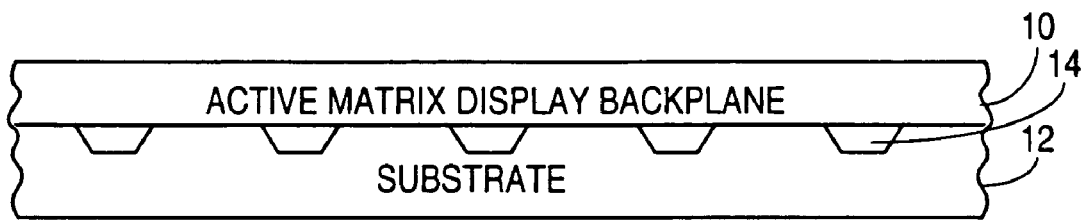
FIG. 1B shows a planar side view of an active matrix display backplane coupled to a rigid substrate wherein a plurality of blocks are part of the active matrix display.
Figure 1C:
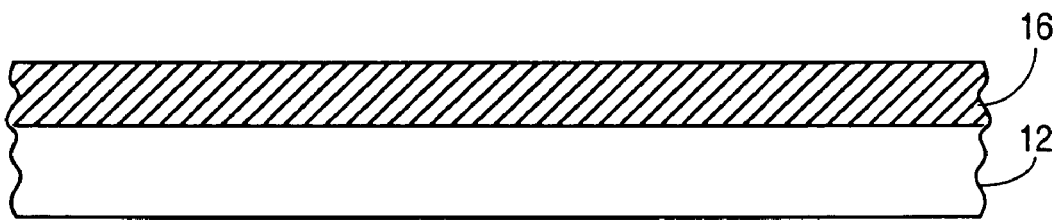
FIG. 1C shows a planar side view of a reflective display backplane coupled to a rigid substrate.
Figure 1D:
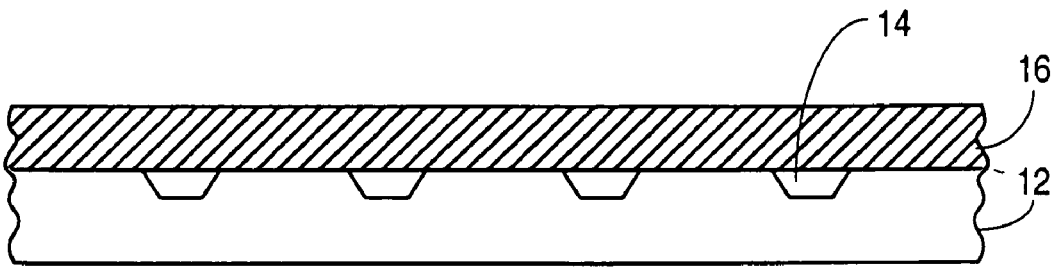
FIG. 1D shows a planar side view of a reflective display backplane coupled to a rigid substrate wherein a plurality of blocks are coupled to the reflective display and to the rigid substrate.
Figure 2:
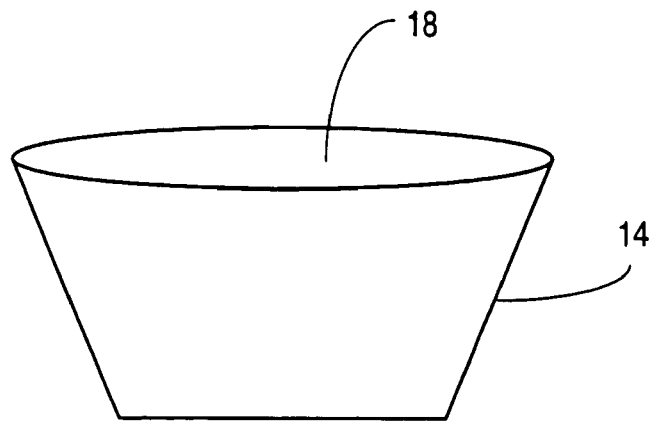
FIG. 2 shows a top side perspective view of a circuit element block.
Figure 3:
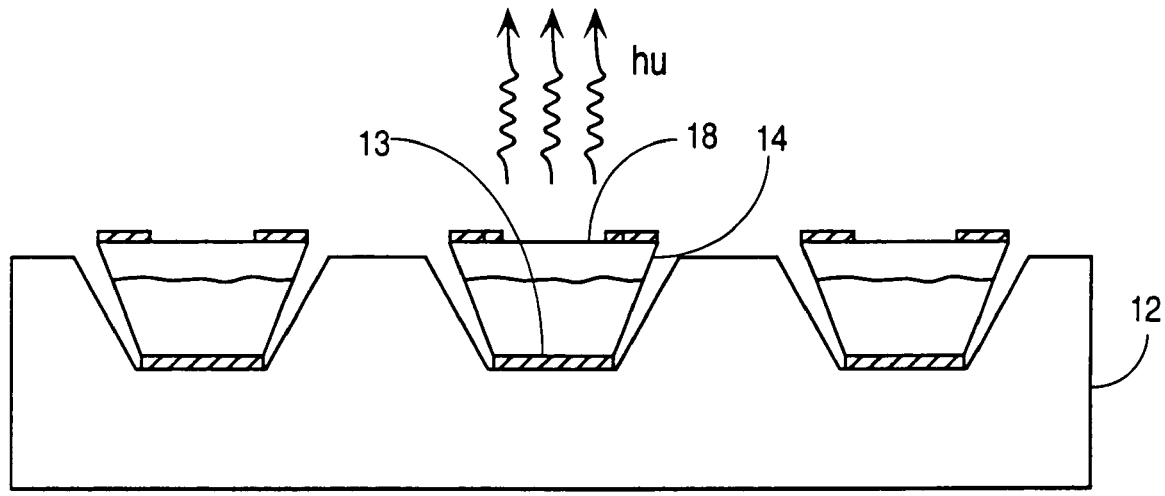
FIG. 3 shows a planar side view of blocks in recessed regions of the rigid substrate and a metalization surface on the blocks.
Figure 4:
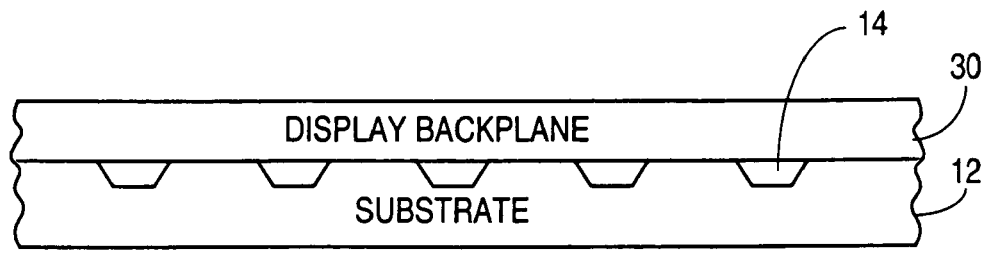
FIG. 4 shows a planar side view of a rigid substrate coupled to a rigid display backplane with a plurality of blocks between the display backplane and substrate.

The present invention relates to apparatuses and methods for forming an assembly having a substrate. The following description and drawings are illustrative of the invention and are not to be construed as limiting the invention.

One embodiment has a web material having a plurality of blocks with an interconnect deposited thereon and the web material is subsequently optionally coupled to a substrate. These displays can be made into active matrix display devices or passive matrix displays. These flexible displays can be fitted to an object which is either rigid or flexible and which has a non-planar surface. Another embodiment of the invention relates to interconnect being deposited onto a web material followed by blocks with circuit elements thereon being seated in recessed regions or holes in the web material. Other embodiments of the invention include coupling a web material having blocks to a flexible continuous substrate upon which multiple flexible displays are fabricated. The multiple flexible displays may be of similar or different sizes. These displays are separated from one another as the substrate is advanced through the web processing apparatus. The backplane of the display may be comprised of a plurality of blocks wherein each block has a circuit element thereon. The blocks are contained in a slurry which is deposited onto the flexible substrate. Although blocks may be comprised of single crystal silicon or other like material which makes the block rigid, the substrate may still be flexible because the size of these blocks (50×100 microns or 100×100 microns) is small in comparison to the flexible substrate. The flexible substrate forms part of a display backplane. The flexible displays may be either an active matrix or a passive matrix displays.

Another embodiment of the invention relates to a flexible substrate with a reflective display backplane that has tape with interconnect deposited thereon.

Incorporated by reference is U.S. Pat. No. 5,545,291 explaining how to assemble microstructures onto a substrate; this process may be referred to said FSA (fluidic self assembly), and this process may be performed with a web material. With certain embodiments of the invention, a web material is advanced through a web process apparatus. The FSA process deposits a plurality of blocks onto the web material wherein the blocks fall into recessed regions found in the web material. The web material is then advanced to a further point in the process wherein an interconnect layer is deposited thereon. In one embodiment, the interconnect includes a dielectric layer to provide a multiple layer interconnect. While the web material is advanced, a display tape is advanced to a point wherein the web material becomes coupled to the display tape. This assembly is then coupled to flexible or rigid substrate (or no substrate).

Before the coupling takes place, in certain embodiments interconnect pattern is placed onto the web material that is used to form the backplane. A display material is then deposited onto the display tape. The display material may be cholesteric liquid crystal, polymer-dispersed liquid crystal or other type of material. The display material is layered or patterned on the display tape. The display tape may also include an electrical interconnect (e.g. a cover "glass" electrode) and this interconnect may be deposited and/or etched on the display material. This is done by using laser etch, ink jet, screen print, deposit, ultraviolet light (UV) or lithography and etch.

A continuous process as in certain embodiments of the invention offers the advantage of increasing the number of flat-panel displays produced, thereby reducing the cost of manufacturing the displays. FSA in conjunction with a deterministic method of placing blocks (e.g., "pick and place") with circuit elements of objects onto a web process material is also disclosed. In this aspect of the invention, the recessed regions of the web material are checked for empty regions. If there is an empty recessed region in the web material, an object is robotically placed into the empty recessed region. The advantage offered by robotically placing an object into an empty recessed region of a web material is that it increases the overall effectiveness and the quality of the displays.

In the following description, numerous specific details such as specific materials, processing parameters, processing steps, etc., are set forth in order to provide a thorough understanding of the invention. One skilled in the art will recognize that these details need not be specifically adhered to in order to practice the claimed invention. In other instances, known processing steps, materials, etc. are not set forth in order not to obscure the invention.

Figure 7A:
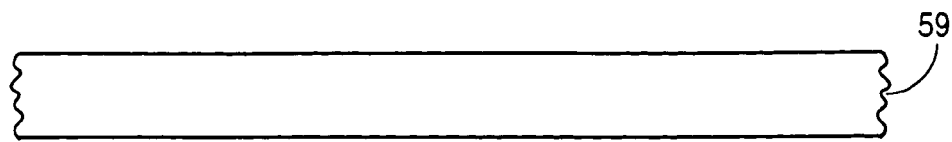
FIGS. 7A–7G show an assembly of a display wherein blocks are deposited therein followed by a layer of interconnect. The web material is then coupled to a substrate.
Figure 7B:
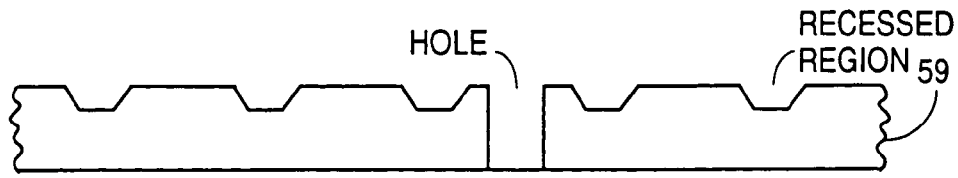
Figure 7C:
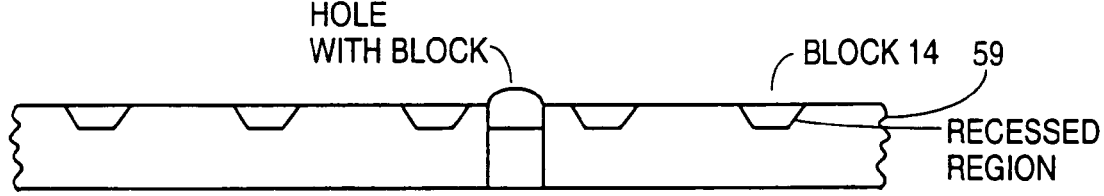

FIGS. 7A–7F show one embodiment of the invention where blocks are placed onto the web material followed by single or multiple layers of interconnect. FIG. 7A shows a substrate 59 which may be a flexible web material. FIG. 7B shows a planar side view of web material 59 having recessed regions or holes therein. These recessed regions or holes may be created by a variety of methods. For example, the recessed regions or holes may be created by a web wheel, roller, or template, that have protruding structures as described in U.S. Patent Application entitled Apparatuses and Methods for Forming Assemblies (Docket No. 003424.P016) by Jeffrey Jay Jacobsen. The hole may be circular in shape but does not separate the web material into pieces. Another method involves using a template having blocks wherein the blocks are pressed into web material 59 making recessed regions or holes into the web material 59 (see U.S. Patent Application entitled "Methods for Transferring Elements From a Template to a Substrate" (Docket No. 003424.P009) describing the donor transfer method). FIG. 7C shows a planar side view of web material 59 wherein the blocks are seated in the recessed regions or holes. The blocks 14 comprise an active circuit element (not shown) which drives a picture element (not shown). The holes may be used to create an electrical interconnect from one side of the web material to the other side through a conductor in the hole.

Figure 7D:
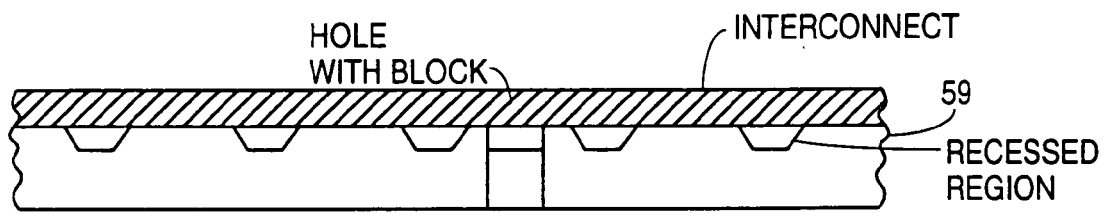

FIG. 7D shows a planar side view of web material 59 wherein an electrical interconnect is deposited onto the web material 59. Interconnect may be comprised of conductive polymers, metals (e.g., aluminum, copper, silver, gold, etc.), metal particles, conductive organic compounds, or conductive oxides. The techniques used for creating Tape Automated Bonding (TAB) tape in the semiconductor industry may be used to create flexible interconnect layers. Numerous methods of depositing interconnect are described in more detail below. The interconnect may be patterned to create an intricate wiring pattern such as row and/or column interconnects for an active matrix display backplane.

It should be noted that web generally involves a roll process is a flexible sheet with very high aspect ratios such as 25:1 or more (length:width). For example, a roll of paper towel when unrolled is said to be in web form and it is fabricated in what is known as a web process. When a web is coiled, it is in a roll form.

Figure 7E:
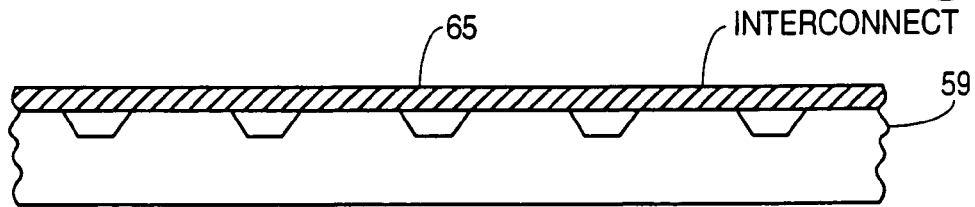
Figure 7F:
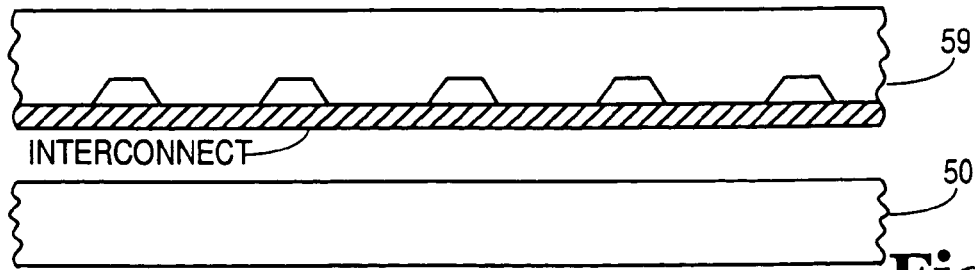
Figure 7G:
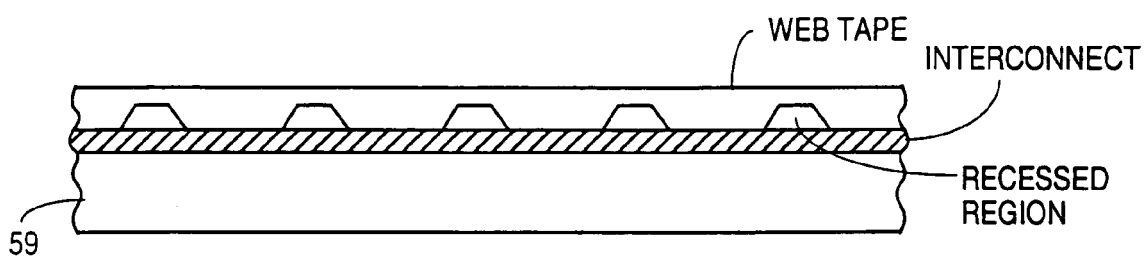
Figure 7H:
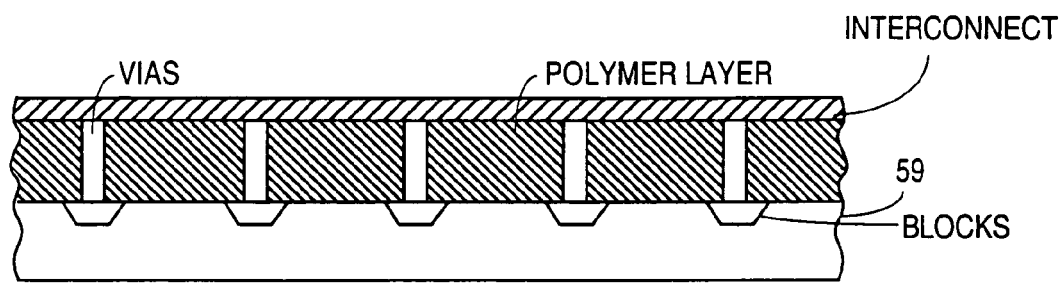
FIG. 7H shows a polymer layer in between the interconnect (or dielectric layer) and the web material.

FIG. 7E shows web material 59 with interconnect 65 deposited thereon. FIG. 7F shows the web material 59 with interconnect 65 of FIG. 7E facing a substrate 50. FIG. 7G shows the web material 59 with interconnect 65 coupled to the substrate 50 of FIG. 7F. FIG. 7H shows a web material wherein blocks are deposited into recessed regions or holes found in the web material. A thin polymer layer is deposited on top of the web material and the blocks. This polymer layer may range in thickness from 1 micron to 5 microns. The interconnect layer, in comparison, ranges in thickness from 1,000 angstroms to 1 micron. In one embodiment, vias are formed through the polymer layer and a conductive material such as an aluminum alloy is formed in the vias to connect the blocks to the interconnect.

Figure 5:
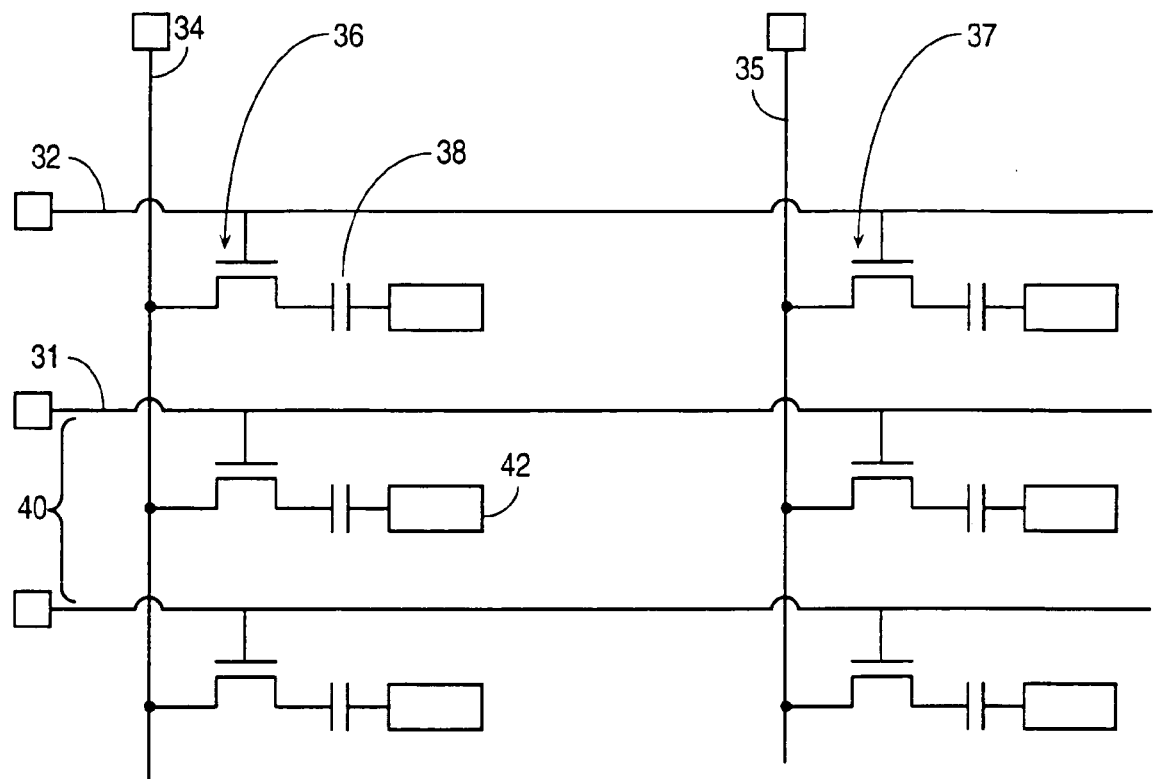
FIG. 5 schematically represents a portion of an array of an active matrix backplane.
Figure 6:
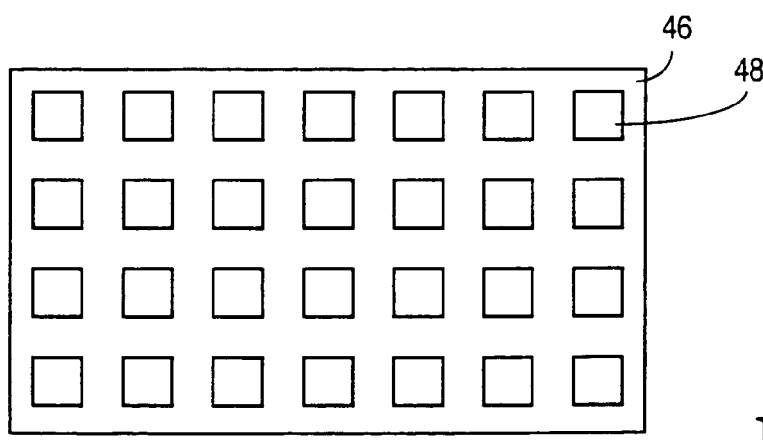
FIG. 6 shows a top view of a plurality of pixel electrodes in a backplane.
Figure 7I:
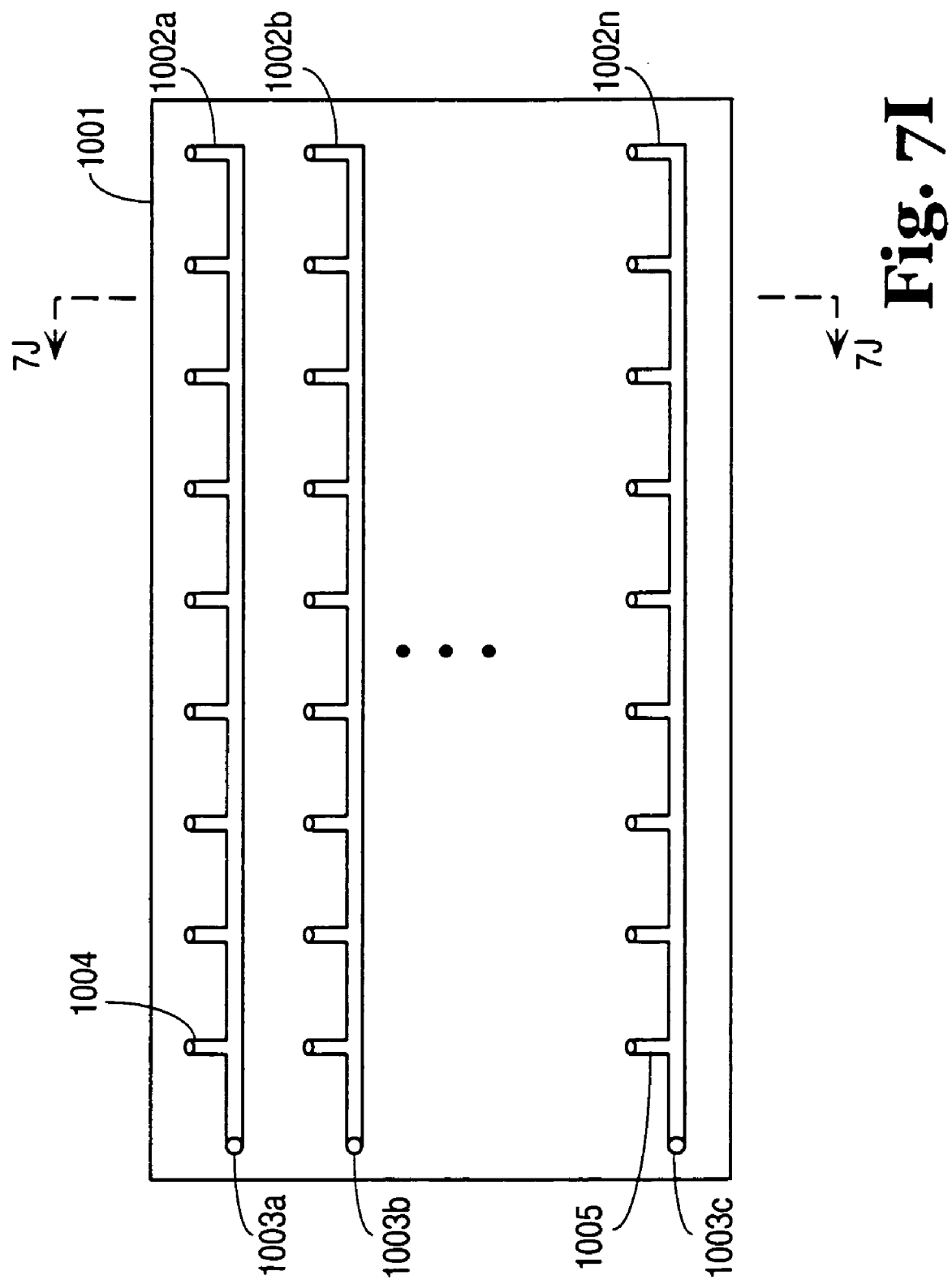
FIG. 7I shows a top view of an example of a flexible ("tape") interconnect layer having a patterned interconnect layer.
Figure 7J:
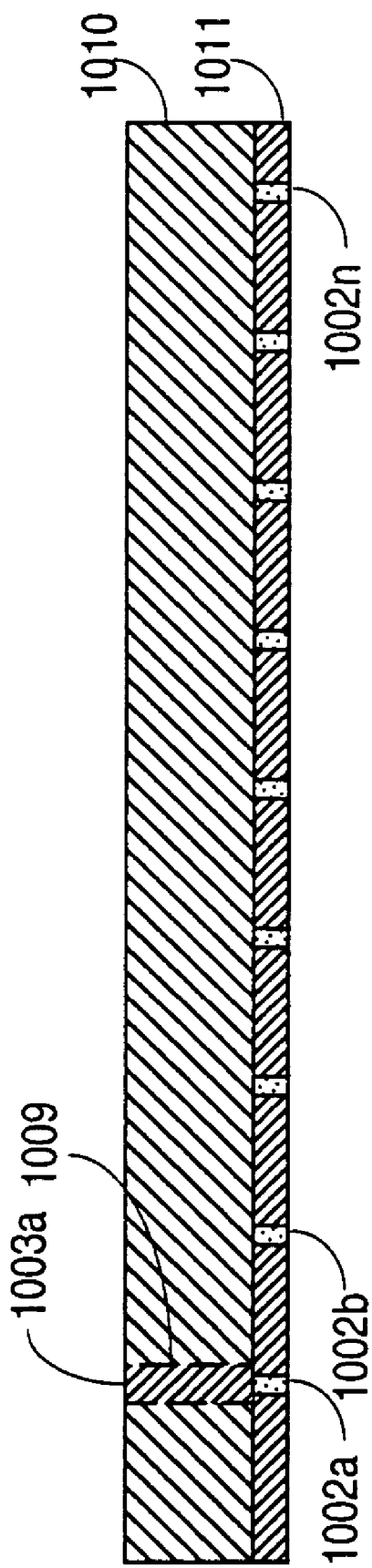
FIG. 7J shows a cross-sectional view of the tape of FIG. 7I.

It will be appreciated that the interconnection pattern (e.g. the rows and columns of FIG. 5) may require either multiple flexible tape layers or a multiple interconnect layer (with dielectric layers between conductive layers) on a flexible tape. The signals from one layer to the next layer are typically transmitted through vias in the layers. Furthermore, the top interconnect layer will typically provide contact pads to which external circuitry may be coupled. It will also be appreciated that many of the planar side views are not representative of (or illustrating) the actual electrical interconnect pattern which may exist. These actual patterns will depend on the application. FIGS. 7I and 7J show an example of an actual electrical pattern which may be created on a flexible interconnect layer, such as a flexible web tape material. The flexible interconnect layer 1001 may be created from one of numerous types of materials which are appropriate for a web tape material which is designed to hold electrically conductive interconnect layer(s); these materials include polyimide tapes on which are deposited a conductive trace of metal. The metal may be deposited directly on the tape (e.g. by a blanket deposition) and then patterned by etching, or a photoresist layer may be applied and patterned, leaving grooves into which metal may be deposited. FIG. 7I shows a planar top view of a flexible interconnect layer 1001 on which a plurality of row interconnects are created. These row interconnects are electrically similar to the row interconnects (e.g. 31 and 32) of FIG. 5. Each row interconnect, such as row interconnects 1002a or 1002b or 1002n, includes a terminal such as terminal 1003a or terminal 1003b or terminal 1003n, which is used to provide a row signal to all of the contact pads along a row, such as contact pad 1004. It will be appreciated that, in one embodiment in which the interconnect layer 1001 is used in an active material liquid crystal display backplane, the contact pads are coupled to the gates of the FETs (e.g. FETs 36 and 37) along a row of the display, and these FETs are disposed in the blocks (e.g. block 14) which are deposited by an FSA process into a substrate, such as the substrate 59. It will be understood that in this embodiment, each block will typically include the pixel driving circuitry for a particular pixel in the liquid crystal display, and the flexible interconnect tape 1001 interconnects electrically the gates of the FETs in each block along a row. The interconnect material on the tape 1001 may directly connect to a contact pad on a block or may connect electrically through a via in a tape which is sandwiched between the flexible interconnect tape 1001 and the block 14. The tape, once created, may be applied to the substrate (or onto another tape on the substrate) in order to electrically interconnect components on the substrate. The tape may also electrically interconnect traces on another tape. It will be appreciated that the flexible interconnect layer 1001 may be fabricated in a web process and then aligned with a substrate having blocks 14 either in a web process or outside of a web process. It will be further appreciated that the substrate may be rigid (and not made in a web process), or the substrate may be flexible and made in a web process. It will also be appreciated that an alignment operation, using conventional techniques, may be necessary to properly align an interconnect tape relative to another interconnect tape, or to a substrate with blocks, when the interconnect tape is coupled to the substrate or to another interconnect tape.

FIG. 7J shows a cross-sectional view of the tape 1001, where the cross-section of tape 1001 of FIG. 7I is taken along the line J7—7J shown in FIG. 7I. As shown in FIG. 7J, a plurality of row interconnects, such as row interconnects 1002a, 1002b and 1002n, are formed in a dielectric layer 1011 which is attached to the main body 1010 of the flexible interconnect layer 1001. The dielectric layer 1011 serves to electrically isolate the row interconnects and to have a flat, planar surface. Alternatively, the row interconnects may be formed on the surface of the main body 1010 such that they protrude from the surface. The dielectric layer may be formed from a photoresist which is patterned to create grooves for the row interconnects which are then deposited into grooves. A via 1009 is shown in the main body 1010 in FIG. 7J. This via 1009 is illustrated in dashed lines because it is not present in the cross-section at line J7—7J of FIG. 7I. but rather this via is behind this cross-section. This via 1009 provides an opening for an electrical interconnection between the row interconnect 1002a on one side of the tape's main body 1010 to the other side of the tape's main body 1010. A conductive post in the via 1009 provides the terminal 1003a which is electrically coupled to the row interconnect 1002a. Similarly, each row interconnect is coupled to a post in a via (not shown) in order to provide row select signals from the post. through the main body 1010 of the tape 1001, and to the row interconnects.

Figure 8A:
FIGS. 8A–8F show an alternative embodiment of the invention. In this embodiment, interconnect is first deposited on web material followed by blocks that are deposited into recessed regions or holes in the web material.
Figure 8B:
Figure 8C:
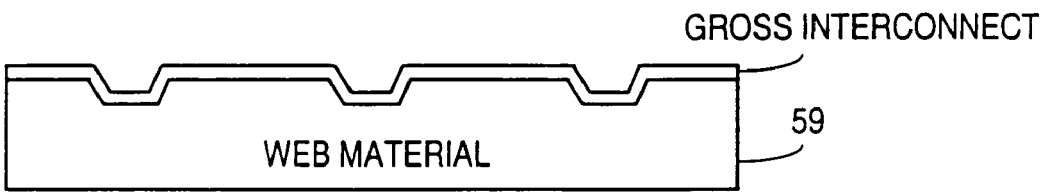
Figure 8D:
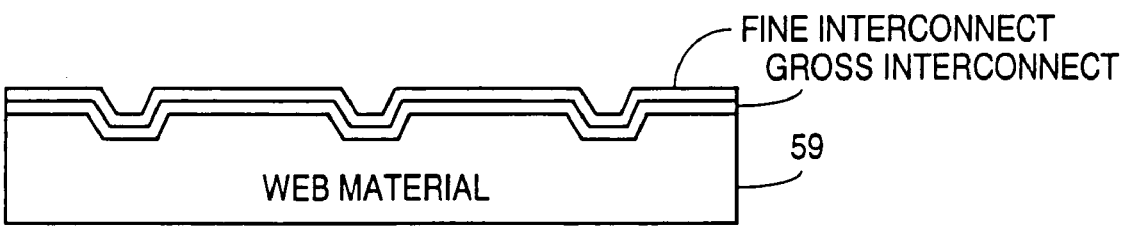
Figure 8E:
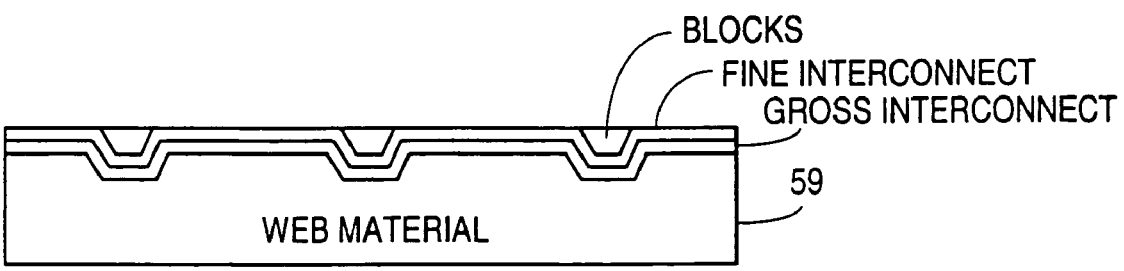
Figure 8F:
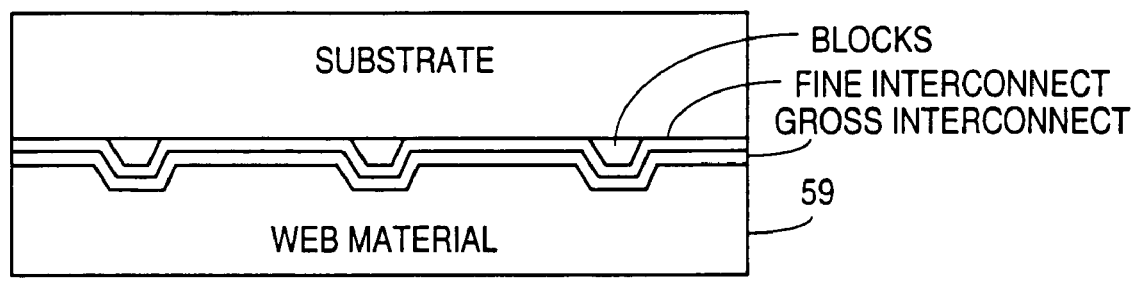

FIGS. 8A–8D show another embodiment of the invention in which interconnect is deposited first on the flexible web material followed by deposition of blocks. FIG. 8A shows a planar side view of web material 59. FIG. 8B shows recessed regions in the web material 59. FIG. 8C shows a gross interconnect deposited onto the web material 59. FIG. 8D shows the device of FIG. 8C with a layer of a fine interconnect deposited on top of the layer of gross interconnect. A dielectric layer may separate the fine and gross interconnects such that they are electrically isolated. In some embodiments, only one interconnect layer is deposited onto the web material before the blocks are deposited. FIG. 8E shows a plurality of blocks deposited (e.g., by an FSA process) onto the interconnect that is coupled to the web material 59. Although a preferred embodiment is to first deposit gross interconnect onto a web material (or a substrate), another embodiment is to first place fine interconnect followed by gross interconnect onto the web material (or substrate). While the side views of FIGS. 8A–8E suggest that the fine and gross conductive interconnect layers (e.g. patterned traces) appear to overlap/overlay each other and hence make electrical contact. they do not have to overlap and make electrical contact. they do not have to overlap and make electrical contact and often they will not. Rather the gross interconnect layer may be deposited first to create a first pattern (to create traces on the flexible substrate 59) and then the fine interconnect layer is deposited next to create a second pattern, and the traces of the two patterns may interconnect at certain points where required for the electrical circuit. Thus, it will be appreciated that the views of FIGS. 8A–8E do not necessarily represent that the two interconnect layers will overlap, although they will normally overlap where the two layers are in electrical contact. It will also be appreciated that a single interconnect layer may be used with the embodiment of FIGS. 8A–8E. It will be understood that the terms gross interconnect and fine interconnect refer to the difference in line width of the traces and/or spacing and/or pitch of the traces in the two types of interconnect. Typically, the traces of a fine interconnect have narrower line widths and they are spaced closer together (a tighter pitch) than the traces of a gross interconnect. A fine interconnect may be used to interconnect smaller devices (e.g. small FETs) in the block 14 on a substrate while the gross interconnect may be used to interconnect larger devices or conductive elements (e.g. pixel electrodes). FIG. 8F shows an example of an assembly having blocks deposited (e.g. through an FSA process) into the recessed regions on the interconnect layers which have been deposited into recessed regions in the flexible web material 59. A substrate is optionally placed onto the blocks and interconnect layers.

Figure 9A:
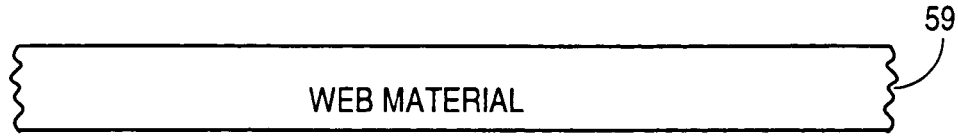
FIGS. 9A–9D show another embodiment of the invention wherein blocks are dispensed onto a web material followed by a layer of interconnect.
Figure 9B:
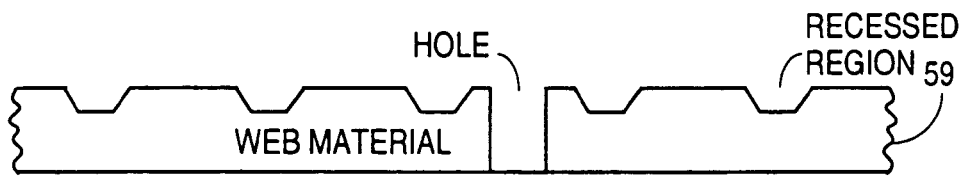
Figure 9C:
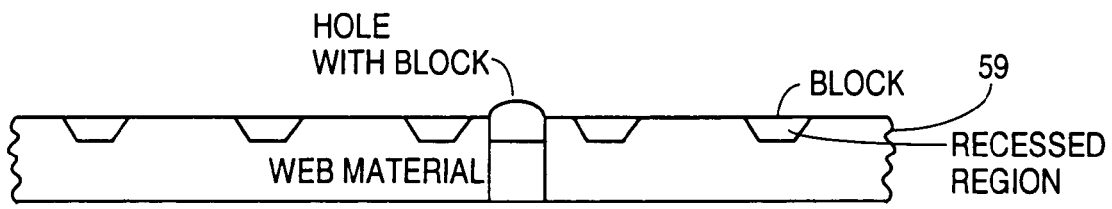
Figure 9D:
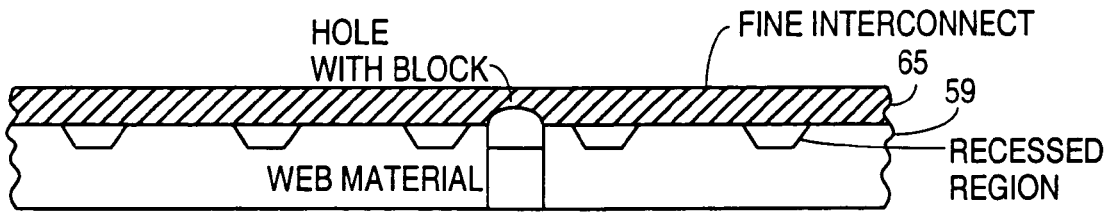

FIGS. 9A–9F show one embodiment of the invention wherein blocks are placed onto the web material followed by single or multiple layers of interconnect. FIG. 9A shows a planar side view of web material 59. FIG. 9B shows a planar side view of web material 59 having recessed regions or holes therein. These recessed regions or holes may be created by a variety of methods. FIG. 9C shows a planar view of web material 59 wherein the blocks are seated in the recessed regions or holes. The blocks comprise in one embodiment an active circuit element (not shown) which drives a picture element (not shown). FIG. 9D shows a planar view of web material 59 of FIG. 9C wherein an interconnect is deposited onto the web material 59. This interconnect 65 may be comprised of copper, aluminum, or other conductive material listed above. Numerous methods of depositing interconnect are described in more detail below. Although fine interconnect is shown, gross interconnect may be used in place of fine interconnect or gross interconnect could be deposited onto the web material followed by a dielectric layer and then followed by a layer of fine interconnect.

Figure 10:
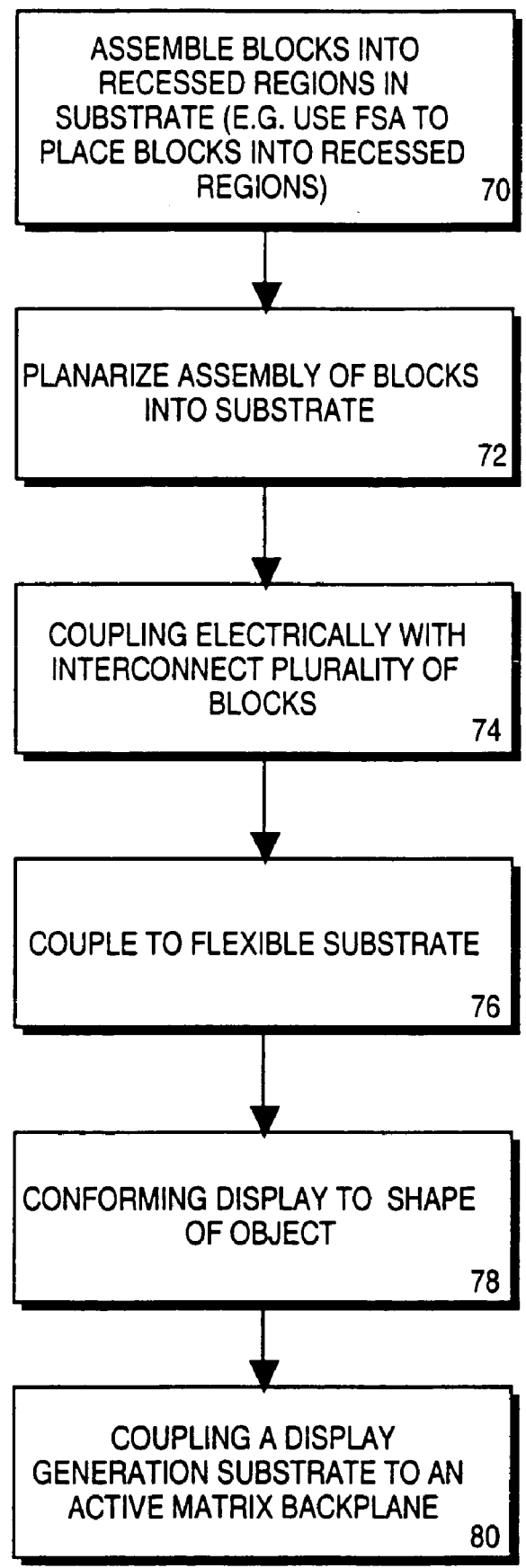
FIG. 10 shows a flow chart of a method of fabricating a display device wherein a web process interconnect is coupled to a web material.

FIG. 10 shows one method of assembling a flexible display along the length of a flexible substrate 70A in accordance with an embodiment of the invention. Initially, blocks are assembled into the openings of the flexible substrate. Utilizing an FSA process, a plurality of blocks are deposited in a slurry and blocks go into the recessed regions of a substrate. Planarization of the assembly of blocks into substrate 72 is the next operation. Extrusion bar coating is one of many methods that may be used to planarize web material. The blocks may then be electrically interconnected using a flexible interconnect layer in operation 74. The display may then be coupled to a substrate in operation 76. The display can be made to conform the object's shape in operation 78. Operations for forming the display may be done in a different order than that found in FIG. 10 and thus the operation 78 may be performed after operation 80. A display generation substrate (e.g., a PDLC layer) is coupled to the active matrix backplane at operation 80.

Figure 11:
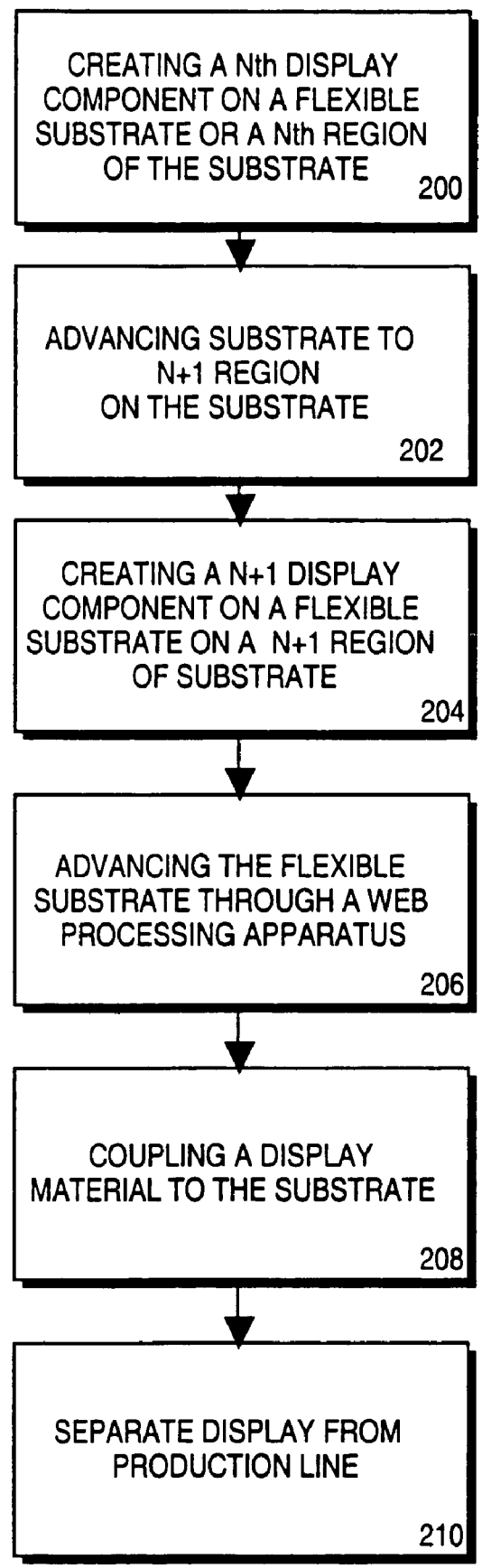
FIG. 11 shows a flow chart of a method of assembling multiple displays using web material with interconnect.

FIG. 11 shows a method of manufacturing multiple displays along a flexible substrate as in a web process. Multiple display components are created on a flexible substrate at operation 200. Interconnect is deposited on web material. Interconnect may be deposited by a variety of methods such as screen printing, laser etching, or dropping display material from container. The flexible substrate is advanced to a second region on the substrate at operation 202. A new display component is created on the flexible substrate in a different region of the substrate at operation 204 by advancing the flexible substrate through a web processing of apparatus at operation 206 and coupling a display material to the substrate at operation 208. Separation of the display panel occurs at the end of the process at operation 210.

Figure 12A:
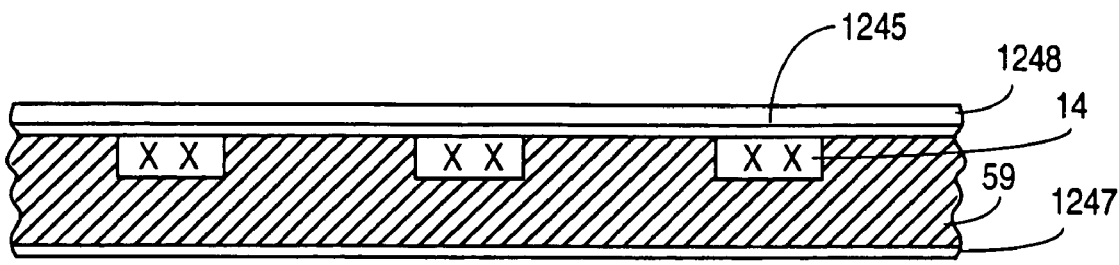
FIGS. 12A–12B show another embodiment of the invention in which a reflective display is assembled using web material.
Figure 12B:
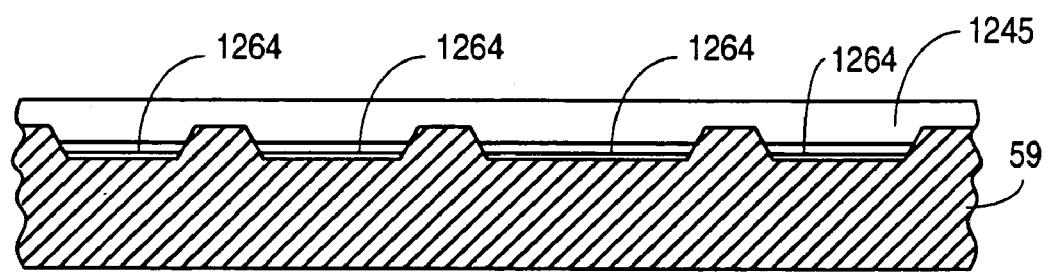

FIGS. 12A–12B show another embodiment of the invention in which a reflective display is assembled. FIG. 12A shows a flexible reflective display. Blocks 14 are coupled to the substrate 59 and to the flexible interconnect layers 1245 and 1248. As in the case of FIG. 8D, the layers 1245 and 1248 do not have to overlap as shown in FIG. 12A except where desired for an electrical interconnect. Coupled to the flexible substrate 59 is a flexible reflector 1247. FIG. 12B shows a flexible reflective display wherein recessed regions contain reflective material 1264. It should be noted that a flexible interconnect layer 1245 could be placed between the plurality of blocks and substrate 59. Interconnect may be fine, gross. or both.

Figure 13:
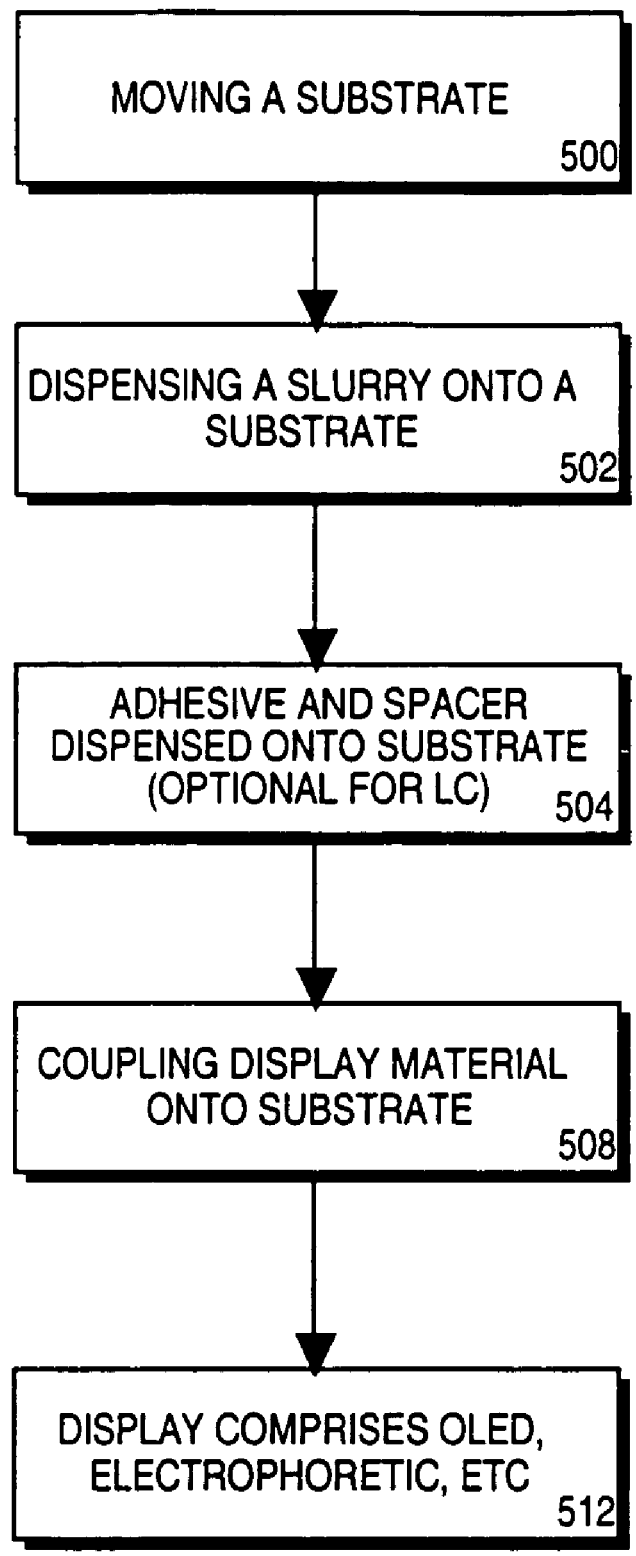
FIG. 13 shows a method of fabricating a display device wherein a web material and a substrate undergo processing and are subsequently coupled.

FIG. 13 shows a method of fabricating a display device wherein a substrate 50 and a substrate undergo processing and are subsequently coupled. There, the substrate 50 is advanced along a process line at operation 500. A slurry containing a plurality of blocks is dispensed onto a substrate at operation 502. A second slurry containing a plurality of blocks is again dispensed onto the substrate. Excess slurry is collected in a container and is recycled. The blocks fall into recessed regions into the substrate. Adhesives and spacers are deposited onto the substrate at operation 504. Display material is placed onto the substrate at operation 508. This material may comprise polymer-dispersed liquid crystal, cholesteric liquid crystal, electrophoretic liquid crystal, upconverting phosphor, or downconverting phosphor.

Figure 14:
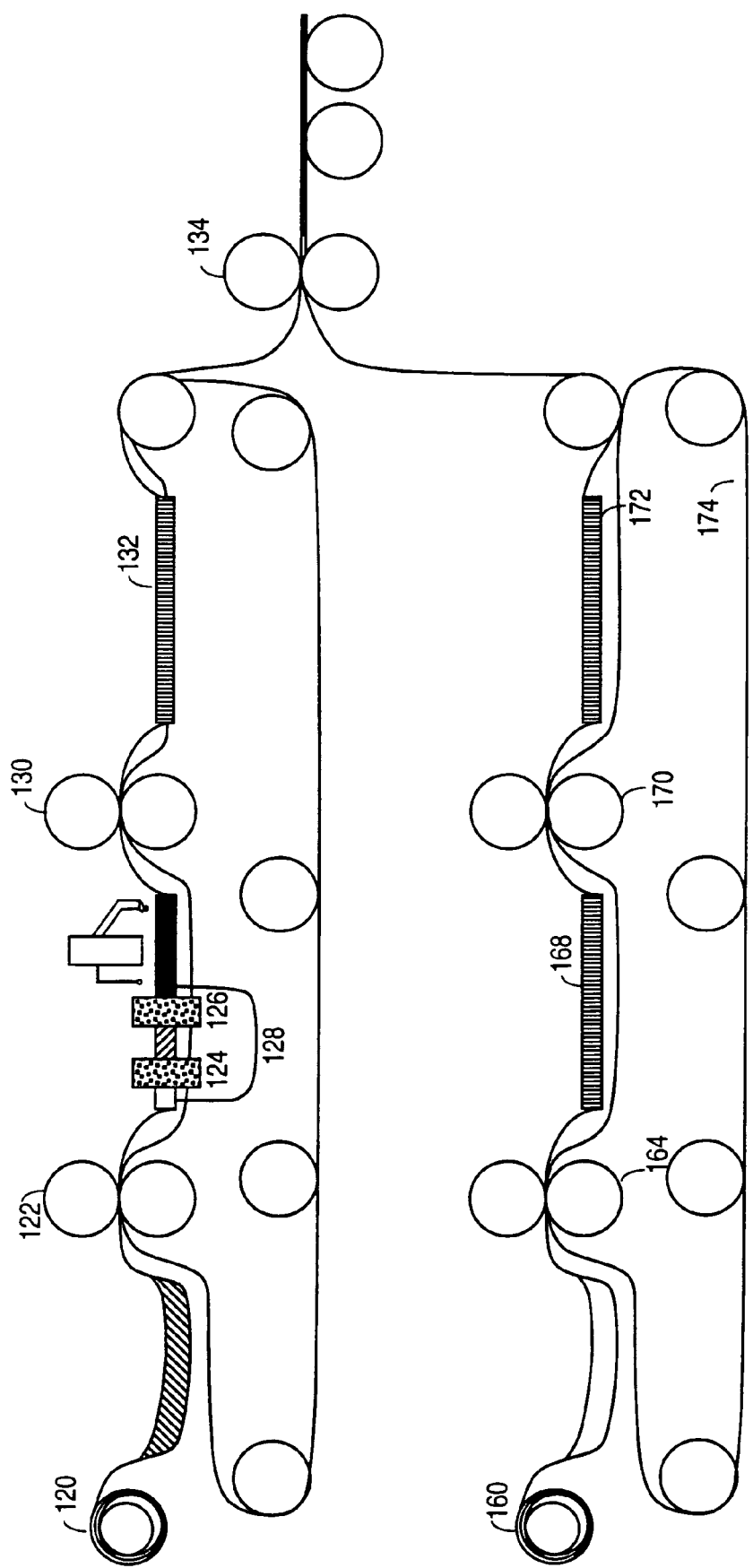
FIG. 14 shows the overall process of fabricating a display device wherein a web material and a display tape undergo processing and are subsequently coupled.

FIG. 14 shows the overall process of fabricating a display device wherein a web material 120 and a display tape 160 undergo processing separately and are subsequently coupled. There, the web material is advanced along a first process line and advances through a first set of support members 122. A first slurry 124 containing a plurality of blocks is dispensed onto the substrate. A second slurry 126 containing a plurality of blocks is again dispensed onto the substrate. Excess slurry is collected in a container 128 and is recycled. The blocks fall into recessed regions in the substrate. Substrate 120 is advanced through a second set of support members 130. An interconnect 132 is then deposited onto the substrate 120. In one embodiment, the interconnect may be a flexible tape which is created in a separate web process, where this tape is joined to the substrate 120. The substrate is then advanced to point 134. In conjunction with this process, display tape 160 undergoes a separate process. Display material is placed onto at least one side of the display tape 160. Display tape 160 is advanced through a first set of support members 164. The display material is patterned or layered at point 168. This display material may comprise polymer-dispersed liquid crystal, cholesteric liquid crystal, electrophoretic liquid crystal, upconverting phosphor, or downconverting phosphor. Display tape 160 is advanced through a second set of support members 170. An interconnect 172 is either deposited or etched onto the display tape 160. The display tape is then advanced to point 134 where the display tape is coupled to the substrate. This assembly (the combination of the processed substrate 120 and the display tape 160) is then coupled to a rigid or flexible substrate. A conveyor belt 174 surrounds the support members.

Figure 15:
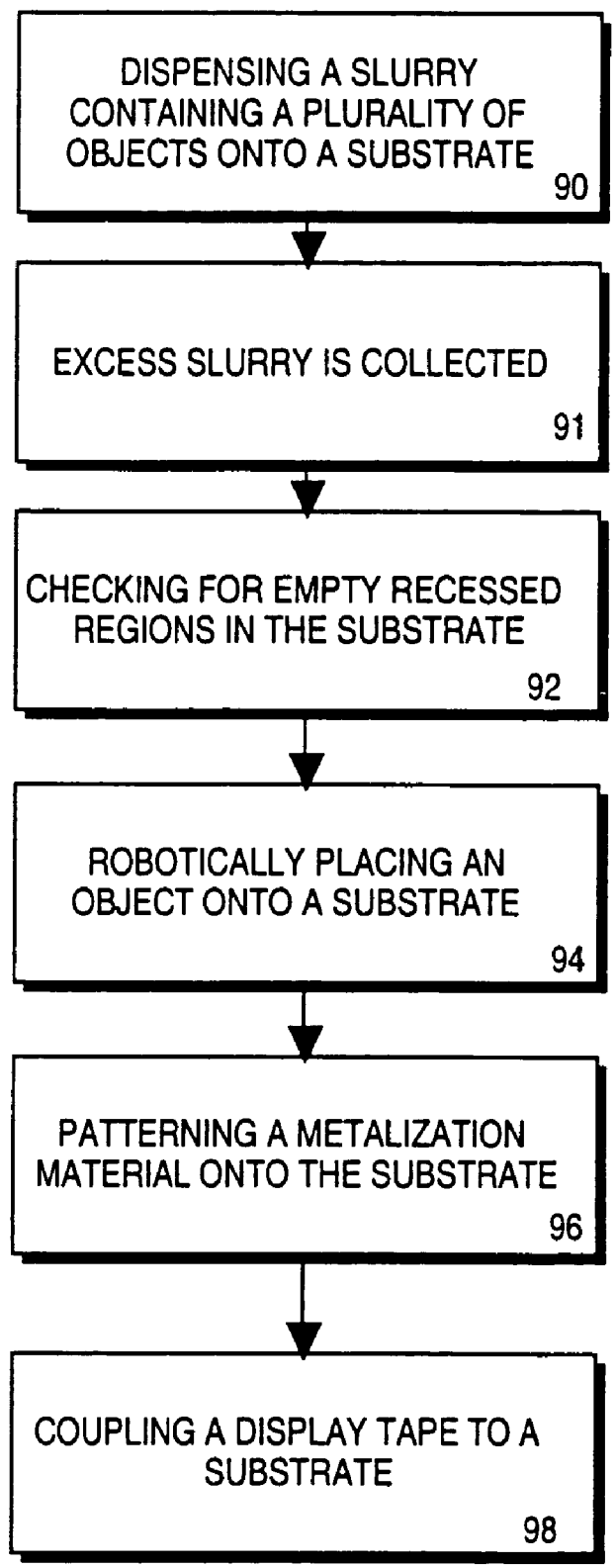
FIG. 15 relates to a method of picking and placing of objects onto a web material after the FSA process has been applied to the web material.

FIG. 15 relates to a method of picking and placing of objects onto a substrate after the FSA process has been applied to the substrate. A slurry containing a plurality of objects is dispensed onto the substrate at operation 90. The objects fall into recessed regions in the substrate. The excess slurry is collected and recycled at operation 91. The substrate is checked for empty recessed regions at operation 92. This checking is performed by a camera which views the substrate. Objects are robotically placed into empty regions found in substrate at operation 94. A metalization material is placed onto at least one of the substrate's surfaces and is patterned or etched at operation 96. The display tape is coupled to the substrate at operation 98.

Figure 16:
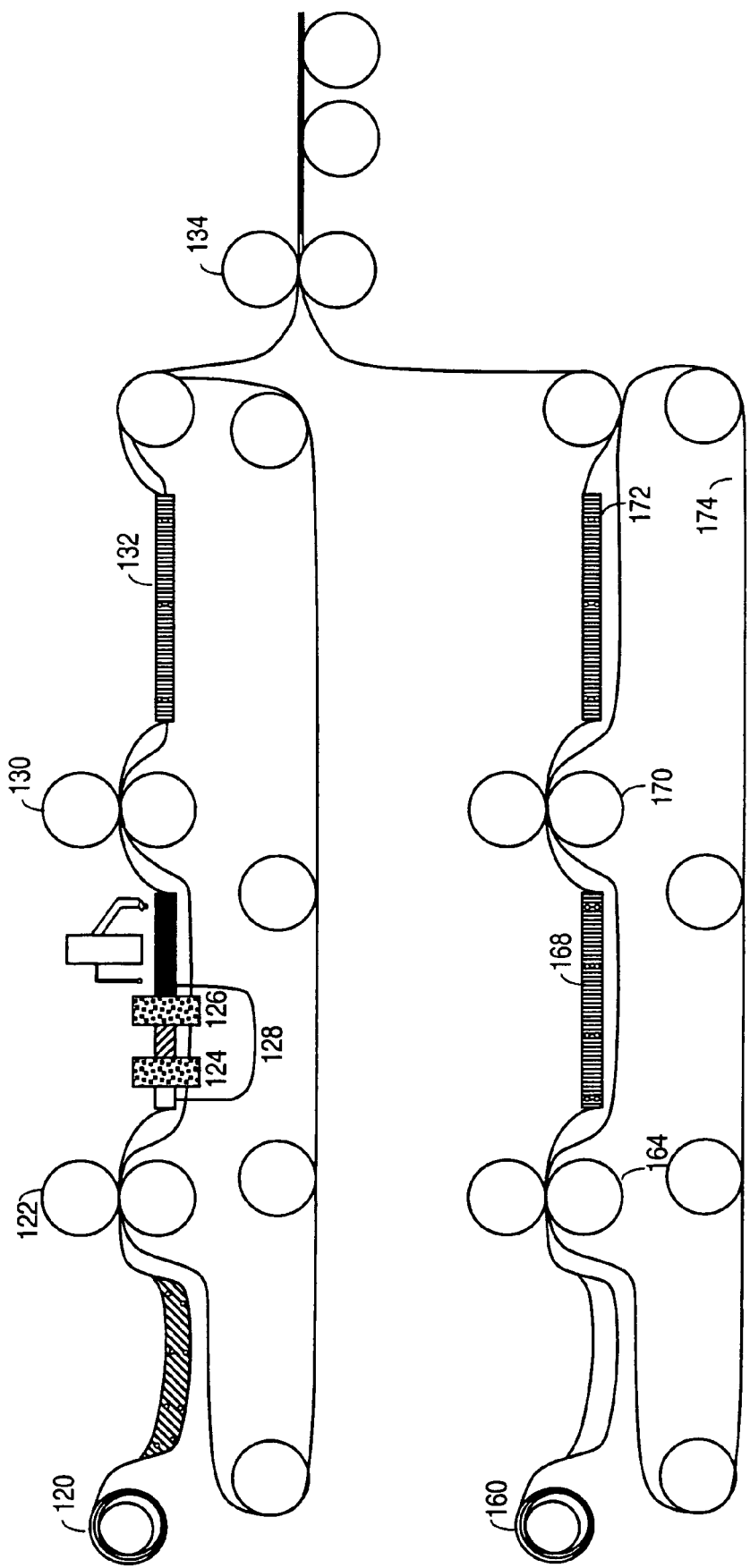
FIG. 16 shows an embodiment of the overall in-line process of the invention.

FIG. 16 shows an embodiment of the overall in-line process of the invention. A web apparatus machine 119 is used to process the substrate. At operation 120, the material is unrolled and apertures are created in the substrate. These apertures can be created by a number of methods. For example, the apertures can be punched into the substrate. Another method involves using a template to create the apertures. A laser could also be used to create the apertures. The substrate advances over a plurality of support members 122. The FSA process is applied to the web material. FSA comprises a slurry which contains a plurality of functional blocks. These blocks have, in one embodiment, a circuit element (not shown) which drives the picture element (not shown). The FSA process occurs at block 124. It is then applied again at 126. The excess slurry is collected in container 128. Then, the substrate advances through support members 130. The substrate then has an interconnect 131 deposited on the top of the flexible substrate 132. The resulting flexible substrate advances over a guide member and meets at a point 134 wherein it is coupled to a display tape which in one embodiment is a flexible substrate which includes separate regions each having a display material on this flexible substrate. A different portion of the process involves the display tape 160. Before the display tape is coupled with the substrate, the display tape goes through its own separate process which is described below.

The display tape has display material 162 deposited on at least one side of the display tape. There are a variety of ways that display material may be deposited onto the display tape. For example, display material may be sprayed onto the display tape; the display material also may be placed on a screen over the display tape; or the display tape may be placed into a container which holds the display material. The display tape advances through support members 164. The display tape then has display material layered or patterned on the display tape at 168.

This display tape then advances through another plurality of support members 170. A large area metal interconnect is then deposited or etched onto the display tape 172. This may be performed by inkjet, lithography and etch. screen print, laser etch, or deposit. In one embodiment of the invention, this large interconnect is a cover glass electrode. At point 14, the display tape is coupled with a substrate.

Figure 17:
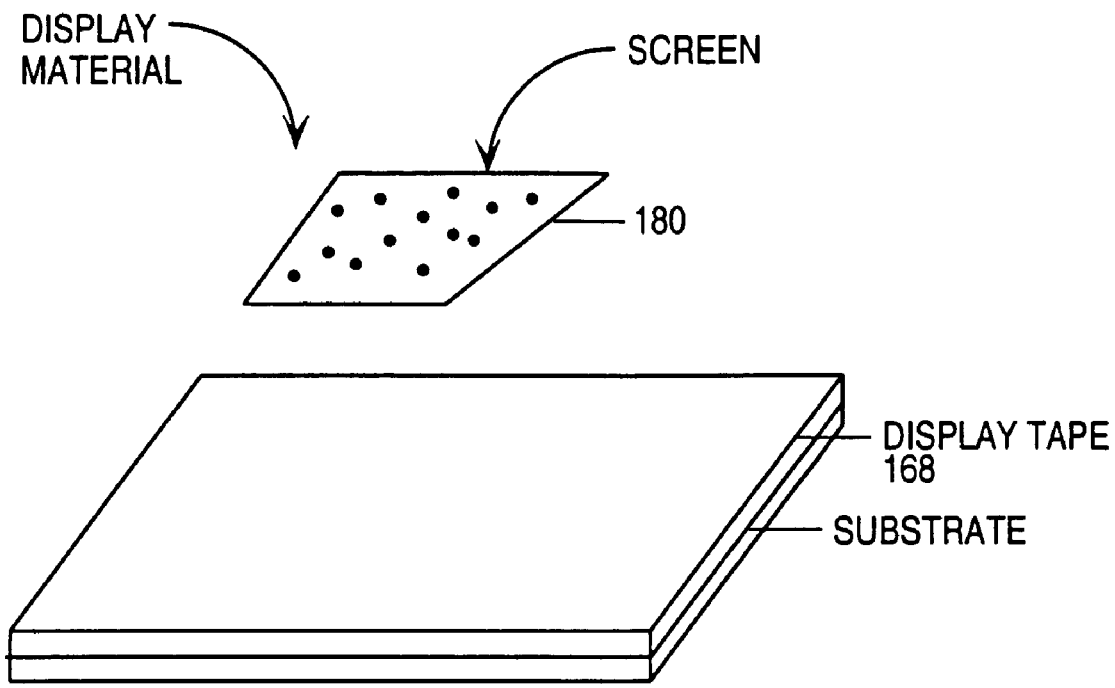
FIG. 17 shows a display material being screen printed.

FIG. 17 shows a display material being placed through a screen 180 onto display tape 168. The screen 180 has a desired pattern created by holes which go through the screen 180. This desired pattern may be dictated by a customer or by the manufacturer.

Figure 18:
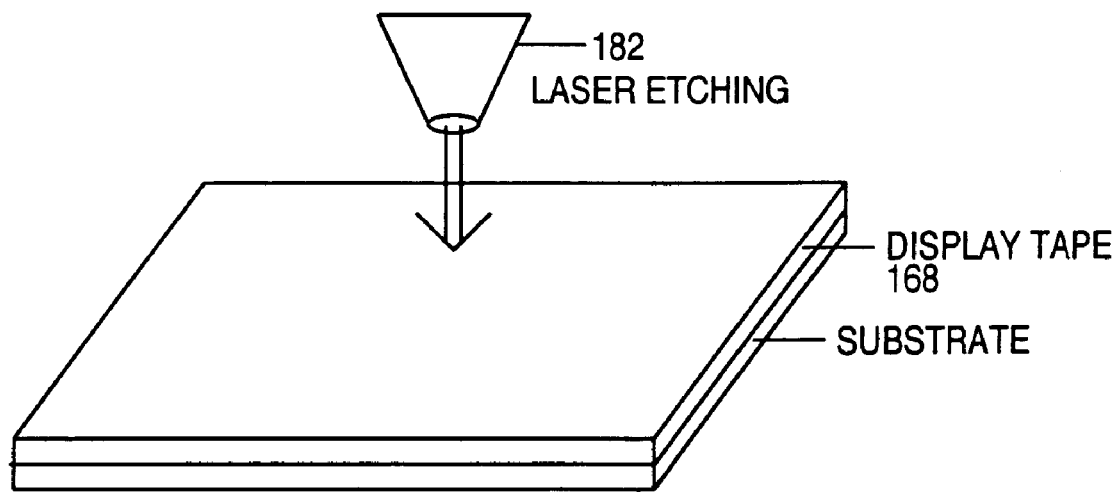
FIG. 18 shows a top view of display material being laser etched.

Another method of placing display material onto the display tape is shown in FIG. 18. FIG. 18 shows a top view of display material being laser etched onto display tape 168. The etching occurs when the high intensity light from the laser 182 strikes the display material on top of the display tape 168. A pattern is created in the display material by the laser 182.

Figure 19:
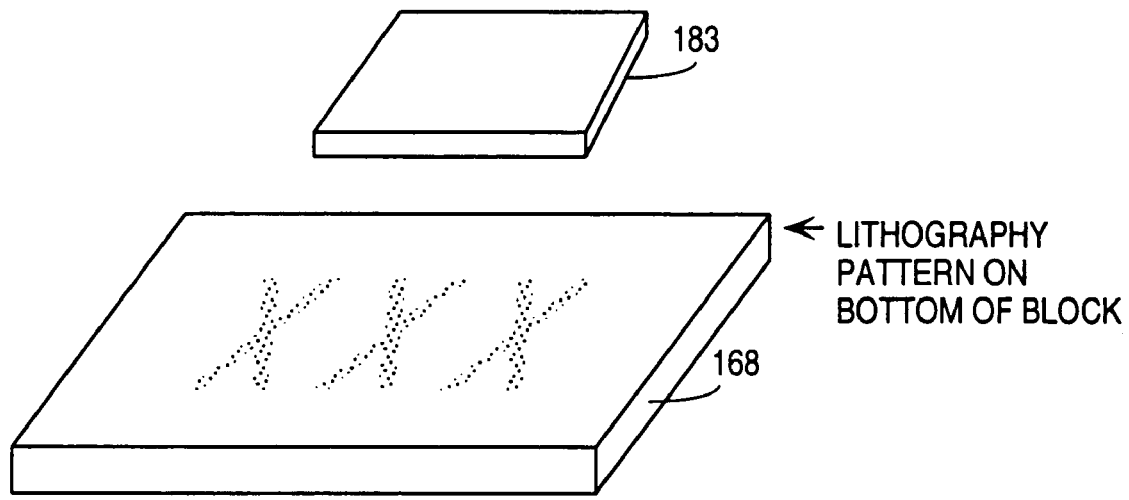
FIG. 19 shows lithography being used to pattern display material.

Another method of depositing display material is shown in FIG. 19. FIG. 19 shows lithography being used to pattern the display material. Lithography involves using a block 183 with a pattern engraved in the bottom surface of the block 183. The bottom surface of the block 183 contacts the display material.

Figure 20:
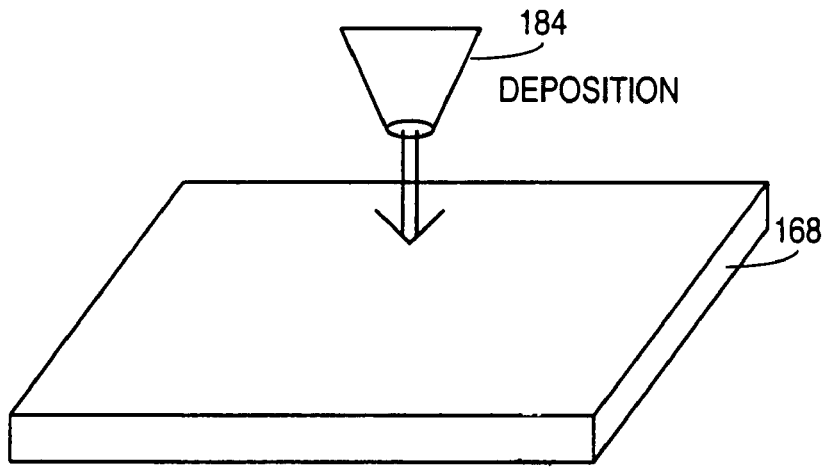
FIG. 20 shows display material being deposited in a pattern.

FIG. 20 shows yet another method of depositing display material onto the display tape. There, display material is deposited in a pattern onto the display tape 168. The display material is deposited by a container 184 which contains the display material. The container 184 is placed over the display tape 168. The display material drops onto the display tape 168 in a pattern.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

Listed below are related U.S. Patent Applications that describe various improvements to the methods and devices of the invention described herein. These patent applications and a U.S. Patent are incorporated by reference.

U.S. patent application Ser. No. 09/270,146, entitled, "Apparatuses and Methods for Forming Assemblies," filed by Jeffrey J. Jacobsen and assigned to the same Assignee as the present invention, describes a method and apparatus of assembling flexible displays. This application is hereby incorporated herein by reference.

U.S. patent application Ser. No. 09/270,157, now U.S. Pat. No. 6,274,508, entitled "Methods for Transferring Elements From A Template To A Substrate", filed by Jeffrey J. Jacobsen, Mark A. Hadley, and John Stephen Smith and assigned to the same Assignee of the present invention, describe an FSA on a template with transfer to another substrate. These applications are hereby incorporated herein by reference.

U.S. patent application Ser. No. 09/270,159, now U.S. Pat. No. 6,316,508, entitled "Methods and Apparatuses for Fabricating A Multiple Module Assembly", filed by Jeffrey J. Jacobsen, Glenn Wilhelm Gengel, and Gordon S. W. Craig and assigned to the same Assignee as the present invention, describes an electronic modular assembly. This application is hereby incorporated herein by reference.

U.S. patent application Ser. No. 09/270,147, now U.S. Pat. No. 6,274,508, entitled "Apparatuses and Methods Used in Forming Electronic Assemblies" filed by Jeffrey J. Jacobsen, Glenn Wilhelm Gengel, and John Stephen Smith and assigned to the same Assignee as the present invention, describes a method of molding substances. This application is hereby incorporated herein by reference.

U.S. patent application Ser. No. 09/270,165, now U.S. Pat. No. 6,281,038, entitled "Apparatuses and Methods for Forming Assemblies", filed by Jeffrey J. Jacobsen and assigned to the same Assignee as the present invention, describes a method of rolling blocks into their recessed regions. This application is hereby incorporated herein by reference.

U.S. Pat. No. 5,545,291 entitled "Method for Fabricating Self-Assembling Microstructures," filed by John S. Smith and Hsi-Jen J. Yeh, issued Aug. 13, 1996.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

We claim:

1. A method of fabricating an electronic assembly, said method comprising:
   providing a substrate with a plurality of blocks each of which includes at least one functional component;
   applying an electrical interconnect layer onto a flexible layer;
   attaching said flexible layer to said substrate;
   electrically coupling said electrical interconnect layer to at least one of said blocks; and
   electrically coupling a flexible antenna to at least one of said plurality of blocks, said flexible antenna being formed on a second substrate.

2. The method of claim 1, wherein said at least one functional component is an electrical component and wherein said blocks are fabricated separately from said substrate and are deposited onto said substrate.

3. The method of claim 1, wherein said substrate is flexible and said blocks are deposited onto recessed regions of said substrate.

4. The method of claim 3, wherein said substrate is attached to said flexible layer in a web process apparatus.

5. The method of claim 3, wherein the blocks are robotically placed into empty recessed regions.

6. The method of claim 1, wherein the flexible layer is selected from the group consisting of polyether sulfone, polyethylene terephthalate, polycarbonate, polybutylene terephthalate, polyphenylene sulfide, polypropylene, polyester, aramid, polyamide-imide, polyimide, aromatic polyimides, polyetherimide, metallic materials, acrylonitrile butadiene styrene, polyvinyl chloride, polyamide, nylon, polybutylene naphthalate, polyethylene naphthalate, polybutylene naphthalate, and polycycloolefins.

7. The method of claim 1, wherein a slurry containing said plurality of blocks is deposited onto the flexible layer.

8. The method of claim 1, wherein the blocks are transferred to said substrate by pressing a template having said blocks into the substrate.

9. The method of claim 1, further comprising applying interconnect onto the web material by laser.

10. The method of claim 1, further comprising applying interconnect onto the flexible layer by photolithography.

11. The method of claim 1, further comprising applying interconnect onto the flexible layer by screen printing.

12. The method of claim 1, further comprising applying interconnect onto the flexible layer by ink jet processes.

13. The method of claim 1, further comprising applying interconnect onto the flexible layer by ultraviolet light.

14. The method of claim 1, further comprising transferring a plurality of blocks to a flexible layer by a template.

15. The method of claim 1, wherein the electrical interconnect layer is selected from the group consisting of aluminum, copper, silver, and gold.

16. The method of claim 1, wherein the flexible antenna is coupled to at least one of said plurality of blocks through an alignment operation.

17. The method of claim 16, wherein the alignment operation occurs when said second substrate is coupled to said flexible layer.

18. The method of claim 1, wherein said substrate carrying a plurality of blocks and said second substrate carrying said flexible antenna are coupled in a web process apparatus.

19. The method of claim 18, wherein said substrate, said flexible layer, and said second substrate are made of a web material.

20. The method of claim 1, further comprising transmitting a signal between said substrate with said plurality of blocks and said second substrate having said flexible antenna.

21. The method of claim 20, wherein said signal is transmitted through at least one via.

22. The method of claim 1, further comprising forming at least one via through said flexible layer.

23. The method of claim 22, further comprising forming a conductive material in said at least one via wherein the conductive material connects at least one of said plurality of blocks to said electrical interconnect.

24. The method of claim 23, wherein the conductive material is an aluminum alloy.

25. The method of claim 22, wherein said at least one via is connected to one of said plurality of blocks.

26. The method of claim 1, wherein said attaching occurs before said applying.

27. A method of fabricating an electronic assembly, said method comprising:
   providing a flexible layer with a plurality of blocks each of which includes at least one functional component;
   applying an electrical interconnect layer onto the flexible layer;
   attaching said flexible layer to a substrate;
   electrically coupling said electrical interconnect layer to at least one of said blocks; and
   electrically coupling a flexible antenna to at least one of said plurality of blocks, said flexible antenna being formed on a second substrate.

28. The method of claim 27, wherein the flexible layer includes the material selected from the group consisting of aluminum, copper, silver, gold, metal, polyether sulfone, polycarbonate, polybutylene terephthalate, polyphenylene sulfide, polypropylene, polyester, aramid, polyamide-imide, polyimide, aromatic polyimides, polyetherimide, acrylonitrile butadiene styrene, polyvinyl chloride, polyamide, nylon, polybutylene naphthalate (PBN), polyethylene naphthate, polybutylene naphthalate, and polycycloolefins.

29. The method of claim 27, wherein the flexible layer is reflective.

30. The method of claim 27, wherein the flexible antenna is coupled to at least one of said plurality of blocks through an alignment operation.

31. The method of claim 30, wherein the alignment operation occurs when said second substrate is coupled to said flexible layer.

32. The method of claim 27, wherein said flexible layer with a plurality of blocks and said second substrate carrying said flexible antenna are coupled in a web process apparatus.

33. The method of claim 32, wherein said substrate, said flexible layer, and said second substrate are made of a web material.

34. The method of claim 27, further comprising transmitting a signal between said flexible layer with said plurality of blocks and said second substrate having said flexible antenna.

35. The method of claim 34, wherein said signal is transmitted through at least one via.

36. The method of claim 27, further comprising forming at least one via through said substrate layer.

37. The method of claim 36, further comprising forming a conductive material in said at least one via wherein the conductive material connects at least one of said plurality of blocks to said electrical interconnect.

38. The method of claim 37, wherein the conductive material is an aluminum alloy.

39. The method of claim 36, wherein said at least one via is connected to one of said plurality of blocks.

* * * * *